US012602529B2

(12) United States Patent
Pal et al.

(10) Patent No.: US 12,602,529 B2
(45) Date of Patent: Apr. 14, 2026

(54) SYSTEMS AND METHODS FOR REDUCING CONGESTION ON NETWORK-ON-CHIP

(71) Applicant: Altera Corporation, San Jose, CA (US)

(72) Inventors: Rahul Pal, Bangalore (IN); Ashish Gupta, San Jose, CA (US); Navid Azizi, Toronto (CA); Jeffrey Schulz, Milpitas, CA (US); Yin Chong Hew, Sungai Petani (MY); Ngo Gia Thuyet, Bayan Lepas (MY); George Chong Hean Ooi, Bayan Lepas (MY); Vikrant Kapila, Singapore (SG); Kok Kee Looi, Permatang Pauh (MY)

(73) Assignee: Altera Corporation, San Jose, CA (US)

( * ) Notice: Subject to any disclaimer, the term of this patent is extended or adjusted under 35 U.S.C. 154(b) by 711 days.

(21) Appl. No.: 17/854,341

(22) Filed: Jun. 30, 2022

(65) Prior Publication Data

US 2022/0405453 A1     Dec. 22, 2022

(51) Int. Cl.
*G06F 5/06* (2006.01)
*G06F 9/30* (2018.01)
(Continued)

(52) U.S. Cl.
CPC ............ *G06F 30/34* (2020.01); *G06F 9/3005* (2013.01); *G06F 9/544* (2013.01); *G06F 5/06* (2013.01); *G06F 30/331* (2020.01); *H01L 25/00* (2013.01)

(58) Field of Classification Search
CPC .......... G06F 5/06; G06F 9/544; G06F 9/3005; G06F 30/331; G06F 30/34; H01L 25/00; H03K 5/0006; H03K 5/00013
(Continued)

(56) References Cited

U.S. PATENT DOCUMENTS 5,559,450 A * 9/1996 Ngai ................ H03K 19/17704
                                                                365/189.08
5,778,420 A * 7/1998 Shitara ................... G06F 3/0676
                                                                711/113
(Continued)

FOREIGN PATENT DOCUMENTS

DE     102020116872 A1 * 9/2021 ............. G06F 16/27
JP        3392067 B2 * 3/2003 ......... G06F 15/7867

OTHER PUBLICATIONS

AMBA@ AXI Protocol Version: 2.0 , Specification, ARM, ARM IHI 0022C (ID030610), Copyright © 2003-2010 ARM.

*Primary Examiner* — Phallaka Kik
(74) *Attorney, Agent, or Firm* — Fletcher Yoder, P.C.

(57) ABSTRACT

Systems or methods of the present disclosure may provide a programmable logic device including a network-on-chip (NoC) to facilitate data transfer between one or more main intellectual property components (main IP) and one or more secondary intellectual property components (secondary IP). To reduce or prevent excessive congestion on the NoC, the NoC may include one or more traffic throttlers that may receive feedback from a data buffer, a main bridge, or both and adjust data injection rate based on the feedback. Additionally, the NoC may include a data mapper to enable data transfer to be remapped from a first destination to a second destination if congestion is detected at the first destination.

11 Claims, 26 Drawing Sheets

(51) Int. Cl.
　　*G06F 9/54* (2006.01)
　　*G06F 30/34* (2020.01)
　　*H01L 25/00* (2006.01)
　　*G06F 30/331* (2020.01)

(58) Field of Classification Search
　　USPC ........ 326/93, 62, 46, 47, 101; 716/117, 132;
　　　　　　　　　　　　　　　710/8, 60, 106, 305
　　See application file for complete search history.

(56) References Cited

U.S. PATENT DOCUMENTS

| | | | | |
|---|---|---|---|---|
| 6,272,583 B1 * | 8/2001 | Sakugawa | ............ | G11C 7/1036 |
| | | | | 710/53 |
| 6,847,640 B1 * | 1/2005 | Modelski | ............ | G06F 13/1689 |
| | | | | 375/376 |
| 7,639,037 B1 * | 12/2009 | Eberle | ................ | H04L 49/9078 |
| | | | | 326/82 |
| 10,833,679 B2 | 11/2020 | Clark et al. | | |
| 11,726,932 B2 * | 8/2023 | Ooi | ......................... | H04L 49/90 |
| | | | | 710/29 |
| 2008/0259894 A1 * | 10/2008 | Gupta | ................. | H04N 21/435 |
| | | | | 370/343 |
| 2008/0259911 A1 * | 10/2008 | Gupta | ................... | H04W 72/30 |
| | | | | 370/356 |
| 2016/0049941 A1 | 2/2016 | How et al. | | |
| 2019/0045421 A1 * | 2/2019 | Shah | ...................... | H04W 40/02 |
| 2020/0272344 A1 * | 8/2020 | Murphy | ............... | G06F 3/0631 |
| 2020/0310810 A1 * | 10/2020 | Murphy | ............... | G06F 9/3004 |
| 2020/0341761 A1 * | 10/2020 | Ramesh | ............. | G06F 9/30018 |
| 2020/0341762 A1 * | 10/2020 | Ramesh | ............. | G06F 9/30014 |
| 2020/0387444 A1 * | 12/2020 | Ramesh | ................ | G06F 3/0679 |
| 2021/0200706 A1 * | 7/2021 | Trout | ................... | G06F 3/0688 |
| 2021/0303491 A1 * | 9/2021 | Ooi | ......................... | H01L 25/18 |
| 2022/0156293 A1 * | 5/2022 | Seshadri | .......... | H03K 19/17752 |
| 2022/0214990 A1 * | 7/2022 | Pugh | ................... | G06F 13/4027 |

\* cited by examiner

704

| PERIPHERY | SECONDARY IP | START ADDRESS | END ADDRESS | REGION MAX SIZE | UNIT |
|---|---|---|---|---|---|
| EMIF(DDR) | HMC0 | 0x0 | 0xFFFFFFFFFF | 1024 | GB |
| | HMC1 | 0x10000000000 | 0x1FFFFFFFFFF | 1024 | GB |
| | HMC2 | 0x20000000000 | 0x2FFFFFFFFFF | 1024 | GB |
| | HMC3 | 0x30000000000 | 0x3FFFFFFFFFF | 1024 | GB |
| | HMC4 | 0x40000000000 | 0x4FFFFFFFFFF | 1024 | GB |
| | HMC5 | 0x50000000000 | 0x5FFFFFFFFFF | 1024 | GB |
| | HMC6 | 0x60000000000 | 0x6FFFFFFFFFF | 1024 | GB |
| | HMC7 | 0x70000000000 | 0x7FFFFFFFFFF | 1024 | GB |
| SPARE | -- | 0x80000000000 | 0xBFFFFFFFFFF | -- | -- |
| HBM* | PC0 | 0xC0000000000 | 0xC003FFFFFFF | 1 | GB |
| | PC1 | 0xC0040000000 | 0xC007FFFFFFF | 1 | GB |
| | PC2 | 0xC0080000000 | 0xC00BFFFFFFF | 1 | GB |
| | PC3 | 0xC00C0000000 | 0xC00FFFFFFFF | 1 | GB |
| | PC4 | 0xC0100000000 | 0xC013FFFFFFF | 1 | GB |
| | PC5 | 0xC0140000000 | 0xC017FFFFFFF | 1 | GB |
| | PC6 | 0xC0180000000 | 0xC01BFFFFFFF | 1 | GB |
| | PC7 | 0xC01C0000000 | 0xC01FFFFFFFF | 1 | GB |
| | PC8 | 0xC0200000000 | 0xC023FFFFFFF | 1 | GB |
| | PC9 | 0xC0240000000 | 0xC027FFFFFFF | 1 | GB |
| | PC10 | 0xC0280000000 | 0xC02BFFFFFFF | 1 | GB |
| | PC11 | 0xC02C0000000 | 0xC02FFFFFFFF | 1 | GB |
| | PC12 | 0xC0300000000 | 0xC033FFFFFFF | 1 | GB |
| | PC13 | 0xC0340000000 | 0xC037FFFFFFF | 1 | GB |
| | PC14 | 0xC0380000000 | 0xC03BFFFFFFF | 1 | GB |
| | PC15 | 0xC03C0000000 | 0xC03FFFFFFFF | 1 | GB |
| AXI-LITE (SIDEBAND) | SIDEBAND0 | 0xC0400000000 | 0xC040001FFFF | 128 | KB |
| | SIDEBAND1 | 0xC0400020000 | 0xC040003FFFF | 128 | KB |
| | SIDEBAND2 | 0xC0400040000 | 0xC040005FFFF | 128 | KB |
| | SIDEBAND3 | 0xC0400060000 | 0xC040007FFFF | 128 | KB |
| | SIDEBAND4 | 0xC0400080000 | 0xC040009FFFF | 128 | KB |
| | SIDEBAND5 | 0xC04000A0000 | 0xC04000BFFFF | 128 | KB |
| | SIDEBAND6 | 0xC04000C0000 | 0xC04000DFFFF | 128 | KB |
| | SIDEBAND7 | 0xC04000E0000 | 0xC04000FFFFF | 128 | KB |
| | SIDEBAND8 | 0xC0400100000 | 0xC040011FFFF | 128 | KB |
| | SIDEBAND9 | 0xC0400120000 | 0xC040013FFFF | 128 | KB |

FIG. 13B

| PERIPHERY | ENTRY(i) | emif_base_addr[i][11:0] | emif_map[i][2:0] | emif_base_mask[i][7:0] | emif_valid[i] |
|---|---|---|---|---|---|
| DDR(EMIF) | 0 | Programmable(default=0) | Programmable(default=0) | Programmable(default=0) | Programmable(default=0) |
| | 1 | Programmable(default=0) | Programmable(default=1) | Programmable(default=0) | Programmable(default=0) |
| | 2 | Programmable(default=0) | Programmable(default=2) | Programmable(default=0) | Programmable(default=0) |
| | 3 | Programmable(default=0) | Programmable(default=3) | Programmable(default=0) | Programmable(default=0) |
| | 4 | Programmable(default=0) | Programmable(default=4) | Programmable(default=0) | Programmable(default=0) |
| | 5 | Programmable(default=0) | Programmable(default=5) | Programmable(default=0) | Programmable(default=0) |
| | 6 | Programmable(default=0) | Programmable(default=6) | Programmable(default=0) | Programmable(default=0) |
| | 7 | Programmable(default=0) | Programmable(default=7) | Programmable(default=0) | Programmable(default=0) |

| PERIPHERY | ENTRY(i) | hbm_base_addr[i][13:0] | hbm_map[i][3:0] | hbm_valid[i] |
|---|---|---|---|---|
| HBM | 0 | Programmable(default = 0) | Programmable(default = 0) | Programmable(default = 0) |
| | 1 | Programmable(default = 0) | Programmable(default = 1) | Programmable(default = 0) |
| | 2 | Programmable(default = 0) | Programmable(default = 2) | Programmable(default = 0) |
| | 3 | Programmable(default = 0) | Programmable(default = 3) | Programmable(default = 0) |
| | 4 | Programmable(default = 0) | Programmable(default = 4) | Programmable(default = 0) |
| | 5 | Programmable(default = 0) | Programmable(default = 5) | Programmable(default = 0) |
| | 6 | Programmable(default = 0) | Programmable(default = 6) | Programmable(default = 0) |
| | 7 | Programmable(default = 0) | Programmable(default = 7) | Programmable(default = 0) |
| | 8 | Programmable(default = 0) | Programmable(default = 8) | Programmable(default = 0) |
| | 9 | Programmable(default = 0) | Programmable(default = 9) | Programmable(default = 0) |
| | 10 | Programmable(default = 0) | Programmable(default = 10) | Programmable(default = 0) |
| | 11 | Programmable(default = 0) | Programmable(default = 11) | Programmable(default = 0) |
| | 12 | Programmable(default = 0) | Programmable(default = 12) | Programmable(default = 0) |
| | 13 | Programmable(default = 0) | Programmable(default = 13) | Programmable(default = 0) |
| | 14 | Programmable(default = 0) | Programmable(default = 14) | Programmable(default = 0) |
| | 15 | Programmable(default = 0) | Programmable(default = 15) | Programmable(default = 0) |

| USER | USER ADDRESS | QUARTUS MAP TO | LOGICAL addr(lower) | LOGICAL addr(upper) | emif_addr_mark | hbm_/emif_base | hbm_/emif_map | PHYS.addr(Lower) | PHYS.addr(Upper) |
|---|---|---|---|---|---|---|---|---|---|
| HBM 0 | 0GB-1GB | HBM2e(PC2) | 0x000_0000_0000 | 0x000_3FFF_FFFF | N/A | 14'b0000_0000_0000_00 | 4'b0101 | 44'hC00_8000_0000 | 44'hC00_BFFF_FFFF |
| EMIF | 16GB-32GB | HMC5 | 0x004_0000_0000 | 0x007_FFFF_FFFF | 8'b0011_1111 | 1'b50000_0000_0100 | 4'b0101 | 44'hC00_0000_0000 | 44'hC503_FFFF_FFFF |
| HBM 1 | 33GB-34GB | HBM2e(PC3) | 0x008_0000_0000 | 0x008_FFFF_FFFF | N/A | 14'b0000_0000_1000_00 | 4'b0101 | 44'hC00_0000_0000 | 44'hC00_FFFF_FFFF |

954 · 956 · 958 · 960 · 962 · 964 · 968 · 970 · 972 · 974
1002 / 1004 / 1006

NoC PHYSICAL ADDRESS — 1010

| PERIPHERY | SECONDARY IP | START ADDRESS | END ADDRESS | REGION MAX SIZE | UNIT |
|---|---|---|---|---|---|
| EMIF(DDR) | HMC0 | 0x0 | 0xFFFFFFFFFF | 1024 | GB |
|  | HMC1 | 0x10000000000 | 0x1FFFFFFFFFF | 1024 | GB |
|  | HMC2 | 0x20000000000 | 0x2FFFFFFFFFF | 1024 | GB |
|  | HMC3 | 0x30000000000 | 0x3FFFFFFFFFF | 1024 | GB |
|  | HMC4 | 0x40000000000 | 0x4FFFFFFFFFF | 1024 | GB |
|  | HMC5 | 0x50000000000 | 0x5FFFFFFFFFF | 1024 | GB |
|  | HMC6 | 0x60000000000 | 0x6FFFFFFFFFF | 1024 | GB |
|  | HMC7 | 0x70000000000 | 0x7FFFFFFFFFF | 1024 | GB |
| SPARE | – | 0x80000000000 | 0x8FFFFFFFFFF | – | – |
| HBM* | PC0 | 0xC000000000000 | 0xC003FFFFFFF | 1 | GB |
|  | PC1 | 0xC004000000000 | 0xC007FFFFFFF | 1 | GB |
|  | PC2 | 0xC008000000000 | 0xC008FFFFFFF | 1 | GB |
|  | PC3 | 0xC00C000000000 | 0xC00FFFFFFFF | 1 | GB |
|  | PC4 | 0xC010000000000 | 0xC013FFFFFFF | 1 | GB |
|  | PC5 | 0xC014000000000 | 0xC017FFFFFFF | 1 | GB |
|  | PC6 | 0xC018000000000 | 0xC018FFFFFFF | 1 | GB |
|  | PC7 | 0xC01C000000000 | 0xC01FFFFFFFF | 1 | GB |
|  | PC8 | 0xC020000000000 | 0xC023FFFFFFF | 1 | GB |
|  | PC9 | 0xC024000000000 | 0xC027FFFFFFF | 1 | GB |
|  | PC10 | 0xC028000000000 | 0xC028FFFFFFF | 1 | GB |

610

PHYSICAL ADDRESS — 1008A
1008B, 1008C, 1008D, 1008E
8192GB — 702H
7168GB — 702G
6144GB — 702F
5120GB — 702E  (EMIF 16GB)
4096GB — 702D
3072GB — 702C
2048GB — 702B
1024GB — 702A
0GB 606 (USER C) LOGICAL ADDRESS
32GB — HBM1 1GB — 1002
16GB — EMIF 15GB
1GB — HBM0 1GB — 1004
0GB — 1006

FIG. 19

Figure 23:
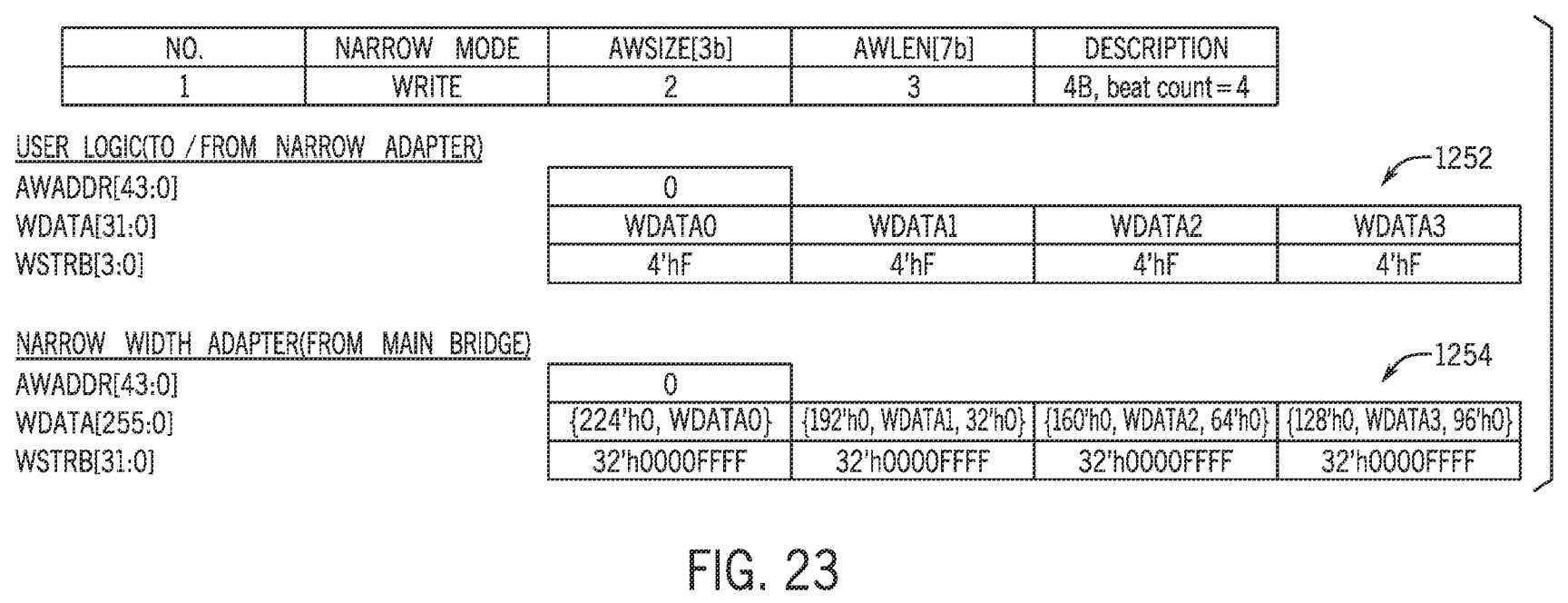

USER LOGIC(TO / FROM NARROW ADAPTER)

| NO. | NARROW MODE | AWSIZE[3b] | AWLEN[7b] | DESCRIPTION |
|---|---|---|---|---|
| 1 | WRITE | 2 | 3 | 4B, beat count=4 |

AWADDR[43:0]

| | 0 | | | |
|---|---|---|---|---|
| WDATA[31:0] | WDATA0 | WDATA1 | WDATA2 | WDATA3 |
| WSTRB[3:0] | 4'hF | 4'hF | 4'hF | 4'hF |

— 1252

NARROW WIDTH ADAPTER(FROM MAIN BRIDGE)

AWADDR[43:0]

| | 0 | | | |
|---|---|---|---|---|
| WDATA[255:0] | {224'h0, WDATA0} | {192'h0, WDATA1, 32'h0} | {160'h0, WDATA2, 64'h0} | {128'h0, WDATA3, 96'h0} |
| WSTRB[31:0] | 32'h0000FFFF | 32'h0000FFFF | 32'h0000FFFF | 32'h0000FFFF |

USER LOGIC(TO / FROM NARROW ADAPTER)

| NO. | NARROW MODE | AWSIZE[3b] | AWLEN[7b] | DESCRIPTION |
|---|---|---|---|---|
| 6 | WRITE | 4 | 3 | 16B, beat count = 4 |

| AWADDR[43:0] | 0 | | |
|---|---|---|---|
| WDATA[127:0] | WDATA0 | WDATA1 | WDATA2 | WDATA3 |
| WSTRB[15:0] | 16'hFFFF | 16'hFFFF | 16'hFFFF | 16'hFFFF |

— 1302

NARROW WIDTH ADAPTER(FROM MAIN BRIDGE)

| AWADDR[43:0] | 0 | | |
|---|---|---|---|
| WDATA[255:0] | {128'h0, WDATA0} | {WDATA1, 128'h0} | {128'h0, WDATA2} | {WDATA3, 128'h0} |
| WSTRB[31:0] | 32'h0000FFFF | 32'h0000FFFF | 32'h0000FFFF | 32'h0000FFFF |

SYSTEMS AND METHODS FOR REDUCING CONGESTION ON NETWORK-ON-CHIP

BACKGROUND

The present disclosure relates generally to relieving network traffic congestion in an integrated circuit. More particularly, the present disclosure relates to relieving congestion in a network-on-chip (NoC) implemented on a field-programmable gate array (FPGA).

A NoC may be implemented on an FPGA to facilitate data transfer between various intellectual property (IP) cores of the FPGA. However, data may be transferred between main IP (e.g., accelerator functional units (AFUs) of a host processor, direct memory accesses (DMAs)) and secondary IP (e.g., memory controllers, artificial intelligence engines) of an FPGA system faster than the data can be processed at the NoC, and the NoC may become congested. Network congestion may degrade performance of the FPGA and the FPGA system, causing greater power consumption, reduced data transfer, and/or slower data processing.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

BRIEF DESCRIPTION OF THE DRAWINGS

Various aspects of this disclosure may be better understood upon reading the following detailed description and upon reference to the drawings in which:

FIG. 13B is a table illustrating how different memory types may be mapped to different addresses of different maximum sizes via the address mapper of FIG. 11, in accordance with an embodiment of the present disclosure;

FIG. 16 is an example of a double data rate (DDR) memory remapping table that may be used to carry out the method of FIG. 14, in accordance with an embodiment of the present disclosure;

FIG. 17 is an example of a high-bandwidth memory (HBM) remapping table that may be used to carry out the method of FIG. 14, in accordance with an embodiment of the present disclosure;

FIG. 19 illustrates another example of mapping multiple logical addresses to multiple physical addresses corresponding to multiple types of secondary IP via the address mapper of FIG. 11, in accordance with an embodiment of the present disclosure;

FIG. 23 is an example of converting write data width via the data width converter of FIG. 21 using the AMBA AXI4 protocol, in accordance with an embodiment of the present disclosure;

FIG. 24 is another example converting write data width via the data width convert of FIG. 21 using the AMBA AXI4 protocol, in accordance with an embodiment of the present disclosure.

DETAILED DESCRIPTION OF SPECIFIC EMBODIMENTS

Figure 1:
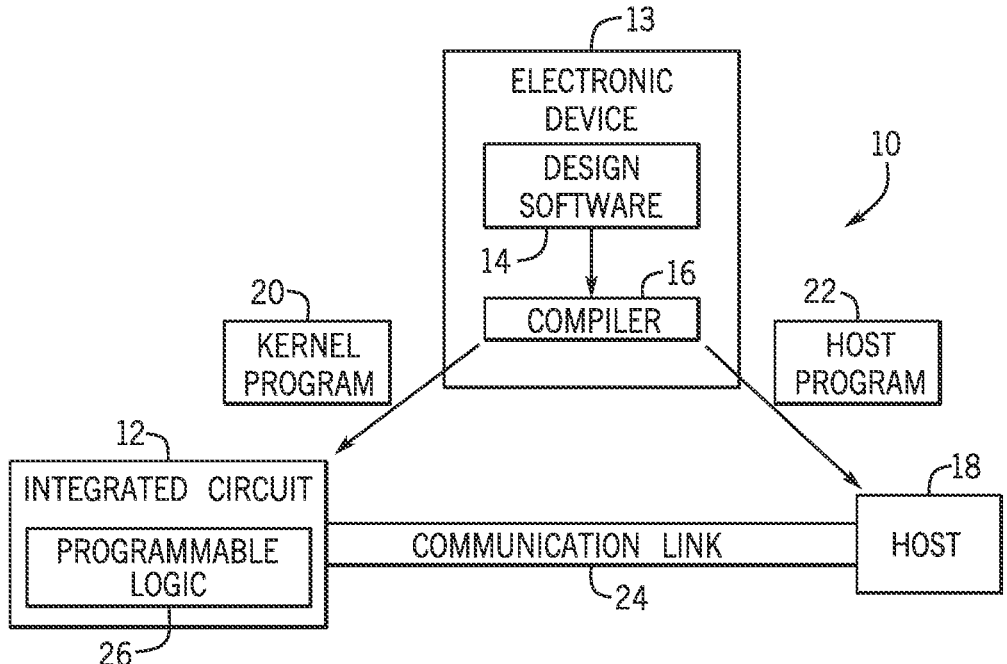
FIG. 1 is a block diagram of a system used to program an integrated circuit device, in accordance with an embodiment of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features.

The present systems and techniques relate to embodiments for reducing data traffic congestion on a network-on-chip (NoC). A NoC may be implemented on an integrated circuit such as a field-programmable gate array (FPGA) integrated circuit to facilitate data transfer between various intellectual property (IP) cores of the FPGA or FPGA system. However, data may be transferred between main IP (e.g., accelerator functional units (AFUs) of a host processor, direct memory accesses (DMAs)) and secondary IP (e.g., memory controllers, artificial intelligence engines) of an FPGA or FPGA system faster than the data can be processed and the NoC may become congested. Network congestion may degrade performance of the FPGA and the FPGA system, causing greater power consumption, reduced data transfer, and/or slower data processing. The main IP and secondary IP may be internal (e.g., on the FPGA itself) or external to the FPGA (e.g., implemented on an external processor of the FPGA system).

In some embodiments, a traffic throttler may be implemented to reduce incoming data when the NoC becomes congested. However, some traffic throttlers may be static, meaning the traffic throttler does not have a feedback mechanism, and thus may not be aware of the traffic on the NoC. Without the feedback mechanism, traffic throttlers may over-throttle or under-throttle the data on the NoC that may limit the FPGA's overall performance. Accordingly, in some embodiments, the traffic throttler may be provided with feedback from various components of the NoC (e.g., a buffer, a secondary bridge, a main bridge, and so on), enabling the traffic throttler to dynamically adjust the throttle rate according to the amount of data coming into the NoC, the amount of data processing in the buffer, the amount of data processing in the main bridge, and so on.

In other embodiments, congestion at the NoC may be prevented or alleviated by remapping a logical address from one physical address to another physical address. For example, if multiple logical addresses are mapped to a single physical address or are mapped to multiple physical addresses pointing to one component (e.g., a memory controller), congestion may form in the NoC at those physical addresses. As such, it may be beneficial to enable one or more logical addresses to be remapped to any number of available physical addresses. For example, data from an AFU may have a logical address corresponding to a physical address associated with a double data rate (DDR) memory controller. However, if congestion occurs at a secondary bridge or a buffer of the DDR memory controller, the logical address of the AFU may be remapped to correspond to a physical address associated with another DDR controller or a controller for another type of memory (e.g., high-bandwidth memory (HBM)). By enabling a logical address to be remapped to various physical addresses, congestion on the NoC may be alleviated without adjusting user logic of the FPGA and without consuming additional logic resources.

While the NoC may facilitate data transfer between multiple main IP and secondary IP, different application running on the FPGA may communicate using a variety of data widths. For example, certain components of the integrated circuit, such as a main bridge, may support 256-bit data throughput while other components may support 128-bit, 64-bit, 32-bit, 16-bit, or 8-bit data throughput. In some embodiments, the lower data widths may be supported by providing at least one instance of a component for each data width a user may wish to support. Continuing with the above example, to support the desired data widths, the integrated circuit may be designed with a 256-bit main bridge, a 64-bit main bridge, a 32-bit main bridge, a 16-bit, and an 8-bit main bridge. Certain components, such as main bridges, may take up significant space on the integrated circuit and may each draw significant power, even when not in use. As such, it may be beneficial to enable an integrated circuit to support various data widths using only one instance of the component instead of several instances of the same component, each supporting a different data width.

As such, a flexible data width adapter that enables narrow data bus conversion for a variety of data widths may be deployed on the integrated circuit. The data width adapter may include an embedded shim that handles narrow transfer by emulating narrow data width components, thus enabling support of various data widths without implementing costly and redundant components that may consume excessive space and power.

With the foregoing in mind, FIG. 1 illustrates a block diagram of a system 10 that may be used in configuring an integrated circuit. A designer may desire to implement functionality on an integrated circuit 12 (e.g., a programmable logic device such as a field-programmable gate array (FPGA) or an application-specific integrated circuit (ASIC) that includes programmable logic circuitry). The integrated circuit 12 may include a single integrated circuit, multiple integrated circuits in a package, or multiple integrated circuits in multiple packages communicating remotely (e.g., via wires or traces). In some cases, the designer may specify a high-level program to be implemented, such as an OPENCL® program that may enable the designer to more efficiently and easily provide programming instructions to configure a set of programmable logic cells for the integrated circuit 12 without specific knowledge of low-level hardware description languages (e.g., Verilog, very high speed integrated circuit hardware description language (VHDL)). For example, since OPENCL® is quite similar to other high-level programming languages, such as C++, designers of programmable logic familiar with such programming languages may have a reduced learning curve than designers that are required to learn unfamiliar low-level hardware description languages to implement new functionalities in the integrated circuit 12.

In a configuration mode of the integrated circuit 12, a designer may use an electronic device 13 (e.g., a computer) to implement high-level designs (e.g., a system user design)

using design software 14, such as a version of INTEL® QUARTUS® by INTEL CORPORATION. The electronic device 13 may use the design software 14 and a compiler 16 to convert the high-level program into a lower-level description (e.g., a configuration program, a bitstream). The compiler 16 may provide machine-readable instructions representative of the high-level program to a host 18 and the integrated circuit 12. The host 18 may receive a host program 22 that may be implemented by the kernel programs 20. To implement the host program 22, the host 18 may communicate instructions from the host program 22 to the integrated circuit 12 via a communications link 24 that may be, for example, direct memory access (DMA) communications or peripheral component interconnect express (PCIe) communications. In some embodiments, the kernel programs 20 and the host 18 may enable configuration of programmable logic 26 on the integrated circuit 12. The programmable logic 26 may include circuitry and/or other logic elements and may be configurable to implement arithmetic operations, such as addition and multiplication.

The designer may use the design software 14 to generate and/or to specify a low-level program, such as the low-level hardware description languages described above. Further, in some embodiments, the system 10 may be implemented without a separate host program 22. Thus, embodiments described herein are intended to be illustrative and not limiting.

Figure 2:
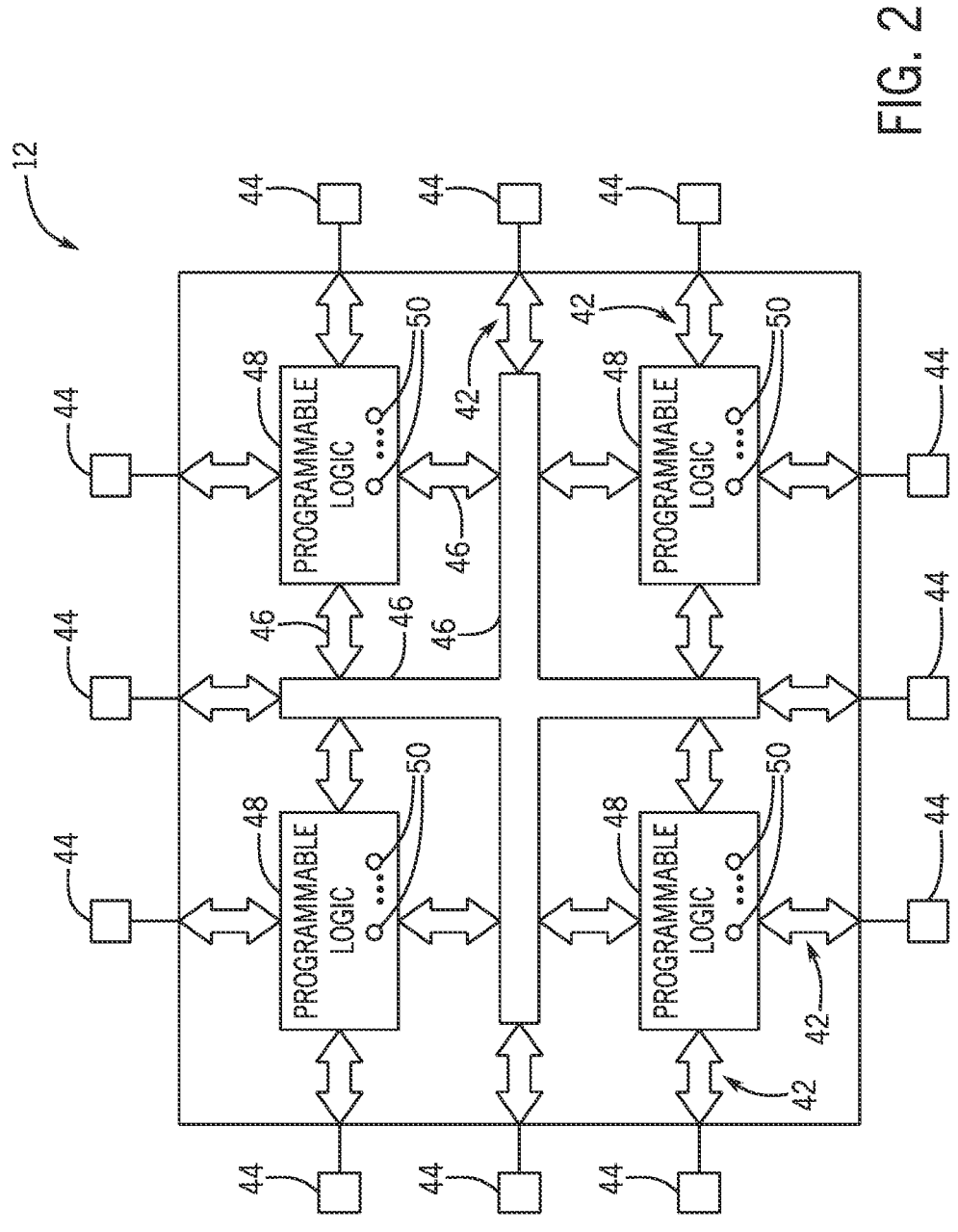
FIG. 2 is a block diagram of the integrated circuit device of FIG. 1, in accordance with an embodiment of the present disclosure.

Turning now to a more detailed discussion of the integrated circuit 12, FIG. 2 is a block diagram of an example of the integrated circuit 12 as a programmable logic device, such as a field-programmable gate array (FPGA). Further, it should be understood that the integrated circuit 12 may be any other suitable type of programmable logic device (e.g., an ASIC and/or application-specific standard product). The integrated circuit 12 may have input/output circuitry 42 for driving signals off of the device (e.g., integrated circuit 12) and for receiving signals from other devices via input/output pins 44. Interconnection resources 46, such as global and local vertical and horizontal conductive lines and buses, and/or configuration resources (e.g., hardwired couplings, logical couplings not implemented by user logic), may be used to route signals on integrated circuit 12. Additionally, interconnection resources 46 may include fixed interconnects (conductive lines) and programmable interconnects (i.e., programmable connections between respective fixed interconnects). Programmable logic 26 may include combinational and sequential logic circuitry. For example, programmable logic 26 may include look-up tables, registers, and multiplexers. In various embodiments, the programmable logic 26 may be configurable to perform a custom logic function. The programmable interconnects associated with interconnection resources may be considered to be a part of programmable logic 26.

Programmable logic devices, such as the integrated circuit 12, may include programmable elements 50 with the programmable logic 26. For example, as discussed above, a designer (e.g., a customer) may program (e.g., configure) or reprogram (e.g., reconfigure, partially reconfigure) the programmable logic 26 to perform one or more desired functions. By way of example, some programmable logic devices may be programmed or reprogrammed by configuring programmable elements 50 using mask programming arrangements that is performed during semiconductor manufacturing. Other programmable logic devices are configurable after semiconductor fabrication operations have been completed, such as by using electrical programming or laser programming to program programmable elements 50. In general, programmable elements 50 may be based on any suitable programmable technology, such as fuses, antifuses, electrically programmable read-only-memory technology, random-access memory cells, mask-programmed elements, and so forth.

Many programmable logic devices are electrically programmed. With electrical programming arrangements, the programmable elements 50 may be formed from one or more memory cells. For example, during programming (i.e., configuration), configuration data is loaded into the memory cells using input/output pins 44 and input/output circuitry 42. In one embodiment, the memory cells may be implemented as random-access-memory (RAM) cells. The use of memory cells based on RAM technology is described herein is intended to be only one example. Further, since these RAM cells are loaded with configuration data during programming, they are sometimes referred to as configuration RAM cells (CRAM). These memory cells may each provide a corresponding static control output signal that controls the state of an associated logic component in programmable logic 26. For instance, in some embodiments, the output signals may be applied to the gates of metal-oxide-semiconductor (MOS) transistors within the programmable logic 26.

Keeping the discussion of FIG. 1 and FIG. 2 in mind, a user (e.g., designer) may use the design software 14 to configure the programmable logic 26 of the integrated circuit 12 (e.g., with a user system design). In particular, the designer may specify in a high-level program that mathematical operations, such as addition and multiplication, be performed. The compiler 16 may convert the high-level program into a lower-level description that is used to configure the programmable logic 26 such that the programmable logic 26 may perform a function.

Figure 3:
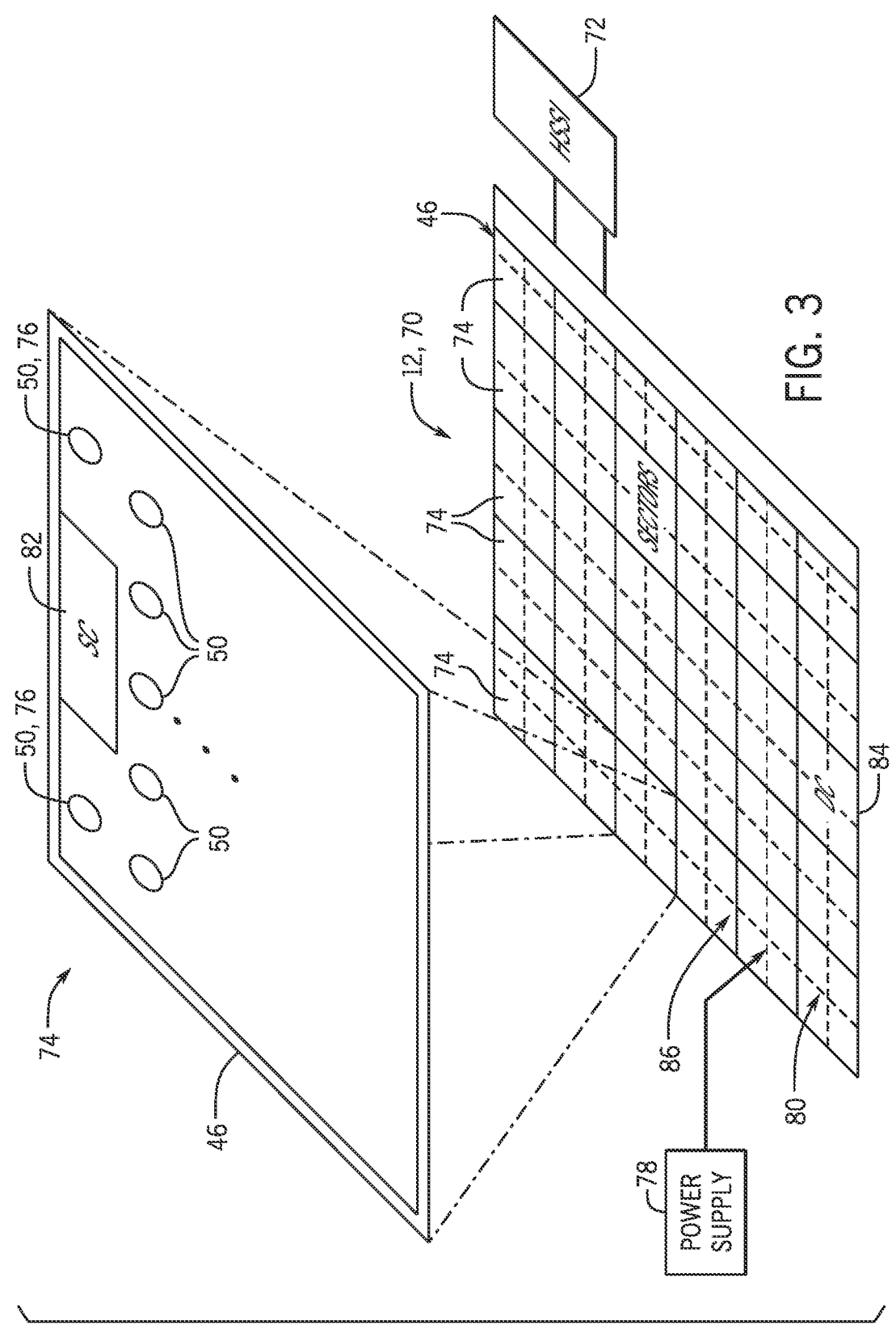
FIG. 3 is a diagram of programmable fabric of the integrated circuit device of FIG. 1, in accordance with an embodiment of the present disclosure.

The integrated circuit device 12 may include any programmable logic device such as a field programmable gate array (FPGA) 70, as shown in FIG. 3. For the purposes of this example, the integrated circuit 12 is referred to as an FPGA 70, though it should be understood that the device may be any suitable type of programmable logic device (e.g., an application-specific integrated circuit and/or application-specific standard product). In one example, the FPGA 70 is a sectorized FPGA of the type described in U.S. Patent Publication No. 2016/0049941, "Programmable Circuit Having Multiple Sectors," which is incorporated by reference in its entirety for all purposes. The FPGA 70 may be formed on a single plane. Additionally or alternatively, the FPGA 70 may be a three-dimensional FPGA having a base die and a fabric die of the type described in U.S. Pat. No. 10,833,679, "Multi-Purpose Interface for Configuration Data and User Fabric Data," which is incorporated by reference in its entirety for all purposes.

In the example of FIG. 3, the FPGA 70 may include transceiver 72 that may include and/or use input/output circuitry, such as input/output circuitry 42 in FIG. 2, for driving signals off the FPGA 70 and for receiving signals from other devices. Interconnection resources 46 may be used to route signals, such as clock or data signals, through the FPGA 70. The FPGA 70 is sectorized, meaning that programmable logic resources may be distributed through a number of discrete programmable logic sectors 74. Programmable logic sectors 74 may include a number of programmable logic elements 50 having operations defined by configuration memory 76 (e.g., CRAM).

A power supply 78 may provide a source of voltage (e.g., supply voltage) and current to a power distribution network (PDN) 80 that distributes electrical power to the various components of the FPGA 70. Operating the circuitry of the FPGA 70 causes power to be drawn from the power distribution network 80.

There may be any suitable number of programmable logic sectors 74 on the FPGA 70. Indeed, while 29 programmable logic sectors 74 are shown here, it should be appreciated that more or fewer may appear in an actual implementation (e.g., in some cases, on the order of 50, 100, 500, 1000, 5000, 10,000, 50,000 or 100,000 sectors or more). Programmable logic sectors 74 may include a sector controller (SC) 82 that controls operation of the programmable logic sector 74. Sector controllers 82 may be in communication with a device controller (DC) 84.

Sector controllers 82 may accept commands and data from the device controller 84 and may read data from and write data into its configuration memory 76 based on control signals from the device controller 84. In addition to these operations, the sector controller 82 may be augmented with numerous additional capabilities. For example, such capabilities may include locally sequencing reads and writes to implement error detection and correction on the configuration memory 76 and sequencing test control signals to effect various test modes.

The sector controllers 82 and the device controller 84 may be implemented as state machines and/or processors. For example, operations of the sector controllers 82 or the device controller 84 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow routines to have multiple variants depending on "modes" the local controller may be placed into. When the control program memory is implemented as RAM, the RAM may be written with new routines to implement new operations and functionality into the programmable logic sectors 74. This may provide usable extensibility in an efficient and easily understood way. This may be useful because new commands could bring about large amounts of local activity within the sector at the expense of only a small amount of communication between the device controller 84 and the sector controllers 82.

Sector controllers 82 thus may communicate with the device controller 84 that may coordinate the operations of the sector controllers 82 and convey commands initiated from outside the FPGA 70. To support this communication, the interconnection resources 46 may act as a network between the device controller 84 and sector controllers 82. The interconnection resources 46 may support a wide variety of signals between the device controller 84 and sector controllers 82. In one example, these signals may be transmitted as communication packets.

The use of configuration memory 76 based on RAM technology as described herein is intended to be only one example. Moreover, configuration memory 76 may be distributed (e.g., as RAM cells) throughout the various programmable logic sectors 74 of the FPGA 70. The configuration memory 76 may provide a corresponding static control output signal that controls the state of an associated programmable logic element 50 or programmable component of the interconnection resources 46. The output signals of the configuration memory 76 may be applied to the gates of metal-oxide-semiconductor (MOS) transistors that control the states of the programmable logic elements 50 or programmable components of the interconnection resources 46.

As discussed above, some embodiments of the programmable logic fabric may be included in programmable fabric-based packages that include multiple die connected using, 2-D, 2.5-D, or 3-D interfaces. Each of the die may include logic and/or tiles that correspond to a power state and thermal level. Additionally, the power usage and thermal level of each die within the package may be monitored, and control circuitry may dynamically control operations of the one or more die based on the power data and thermal data collected.

Figure 4:
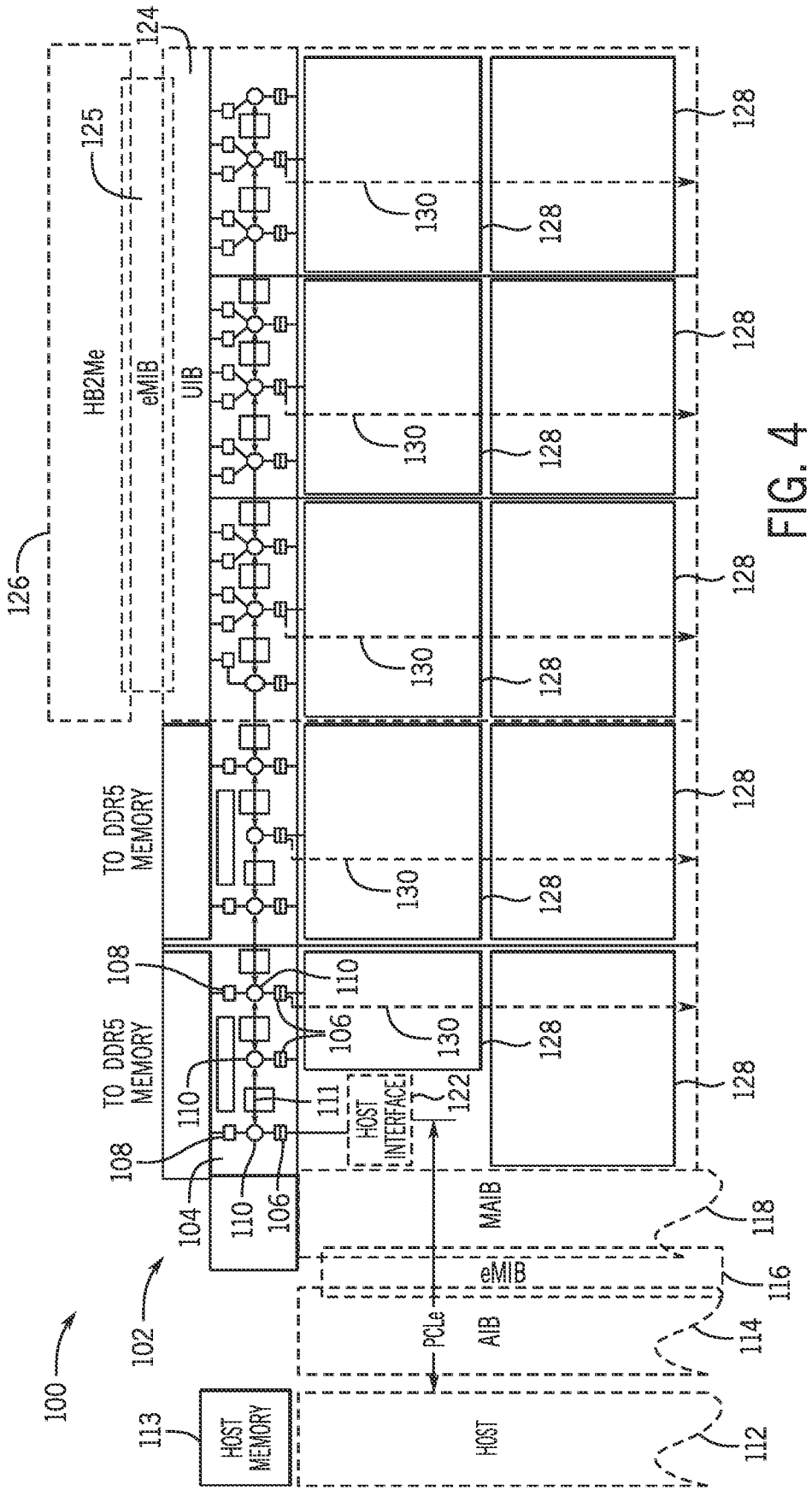
FIG. 4 is a diagram of a field-programmable gate array (FPGA) system including a network-on-chip (NoC), in accordance with an embodiment of the present disclosure.

With the foregoing in mind, FIG. 4 is a schematic diagram of a system including a network-on-chip (NoC) implemented on an FPGA. System 100 may include an FPGA 102 (e.g., the integrated circuit 12, the FPGA 70 or another programmable logic device), a host 112 (e.g., an external processor), a host memory 113, and a high bandwidth memory 126 (e.g., HBM2e). The FPGA 102 may include a NoC 104 that may facilitate data transfers between various main intellectual property components (main IP) (e.g., user designs implementing accelerated functional units (AFUs) of the host 112, direct memory accesses (DMAs), and so on in processing elements) and corresponding secondary intellectual property components (secondary IP) (e.g., memory controllers, artificial intelligence engines, and so on). The NoC 104 may include main bridges 106, secondary bridges 108, switches 110, and links 111. The main bridges 106 may serve as network interfaces between the main IP (e.g., within the host 112 or within processing elements of the FPGA 102) and the NoC 104, facilitating transmission and reception of data packets to and from the main IP. The secondary bridges 108 may serve as network interfaces between the secondary IP and the NoC 104, facilitating transmission and reception of data packets to and from the secondary IP. The switches 110 and the links 111 may couple various main bridges 106 and secondary bridges 108 together.

The main bridges 106 may interface with the host 112 and the host memory 113 via a host interface 122 to send data packets to and receive data packets from the main IP in the host 112. Although only one host interface 122 is illustrated, it should be noted that there may be any appropriate number of host interfaces 122, such as one host interface 122 per programmable logic sector 128, per column of programmable logic sectors 128, or any other suitable number of host interfaces 122 in the integrated circuit 12. The host interface 122 may communicate with the host 112 via an Altera Interface Bus (AIB) 114, a Master Die Altera Interface Bus (MAIB) 118, and a PCI Express (PCIe) bus 120. The AIB 114 and the MAIB 118 may interface via an Embedded Multi-Die Interconnect Bridge (eMIB) 116. The main bridges 106 of the NoC 104 may be communicatively coupled to one or more programmable logic sectors 128 of the FPGA 102 and may facilitate data transfer from one or more of the programmable logic sectors 128. In some embodiments, one or more micro-NoCs may be present in each sector 128 to facilitate local data transfers (e.g., between the NoC 104 and a sector controller or device controller of a single programmable logic sector 128).

As previously mentioned, the secondary bridges 108 may serve as network interfaces between the secondary IP and the NoC 104, facilitating transmission and reception of data packets to and from the secondary IP. For instance, the NoC 104 may interface with DDR memory (e.g., by interfacing with a DDR memory controller). The NoC 104 may interface with the high bandwidth memory 126 (e.g., by interfacing with a high bandwidth memory controller) via a universal interface board (UIB) 124. The UIB 124 may interface with the high bandwidth memory 126 via an eMIB 125. It should be noted that the FPGA 102 and the FPGA 70 may be the same device or may be separate devices. Regardless, the FPGA 102 may be or include programmable logic devices as FPGAs or as any other programmable logic devices, such as ASICs. Likewise, the host 112 may be the same device as or a different device than the host 18. Regardless, the host 112 may be a processor that is internal or external to the FPGA 102. While 10 programmable logic sectors 128 are shown here, it should be appreciated that more or fewer may appear in an actual implementation (e.g., in some cases, on the order of 50, 100, 500, 1000, 5000, 10,000, 50,000 or 100,000 sectors or more).

Figure 5:
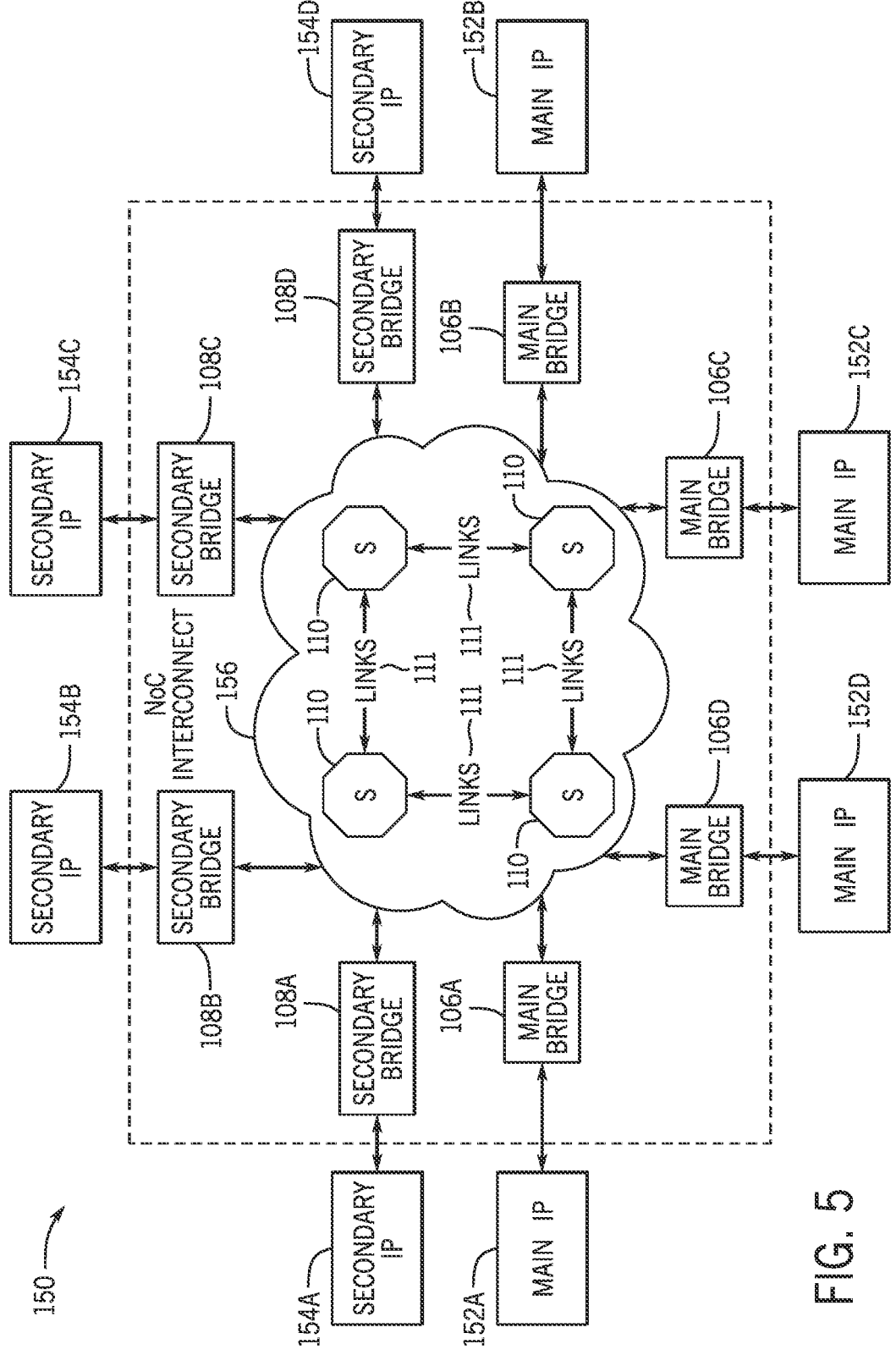
FIG. 5 is a schematic diagram of a system illustrating a portion of the NoC of FIG. 4, in accordance with an embodiment of the present disclosure.

FIG. 5 is a schematic diagram of a system 150 illustrating a portion of the NoC 104 as implemented in the FPGA 102. As may be observed, there may be multiple switches 110 communicatively coupled by the links 111 in a switching network 156. The switches 110 and the links 111 may facilitate data transfer from any of the main IP 152A, 152B, 152C, and 152D (collectively referred to herein as the main IP 152) and main bridges 106A, 106B, 106C, and 106D (collectively referred to herein as the main bridges 106) to any of the secondary IP 154A, 154B, 154C, and 154D (collectively referred to herein as the secondary IP 154) via the secondary bridges 108A, 108B, 108C, and 108D (collectively referred to herein as the secondary bridges 108).

For example, the switching network 156 may transmit data from the main IP 152A via the main bridge 106A and send the data to the secondary IP 154A via the secondary bridge 108A, to the secondary IP 154B via the secondary bridge 108B, to the secondary IP 154C via the secondary bridge 108C, and/or to the secondary IP 154D via the secondary bridge 108D. Additionally, any of the secondary IP 154 (e.g., 154A) may receive data from the main IP 152A, from the main IP 152B, from the main IP 152C, and/or from the main IP 152D. While the switching network 156 is illustrated as a 2×2 mesh for simplicity, it should be noted that there may be any appropriate number of switches 110, links 111, main IP 152, main bridges 106, secondary IP 154, and secondary bridges 108 arranged in a mesh of any appropriate size (e.g., a 10×10 mesh, a 100×100 mesh, a 1000×1000 mesh, and so on).

While the system 150 (and the NoC 104 generally) may increase the efficiency of data transfer in the FPGA 102 and in the system 100, congestion may still occur in the NoC 104. Congestion may be concentrated at the main bridge 106, at the secondary bridge 108, or in the switching network 156. As will be discussed in greater detail below, in certain embodiments a dynamic throttler may be implemented in the NoC 104 to adjust the flow of traffic according to the level of congestion that may occur in different areas of the NoC 104.

Dynamic Traffic Throttler

Figure 6:
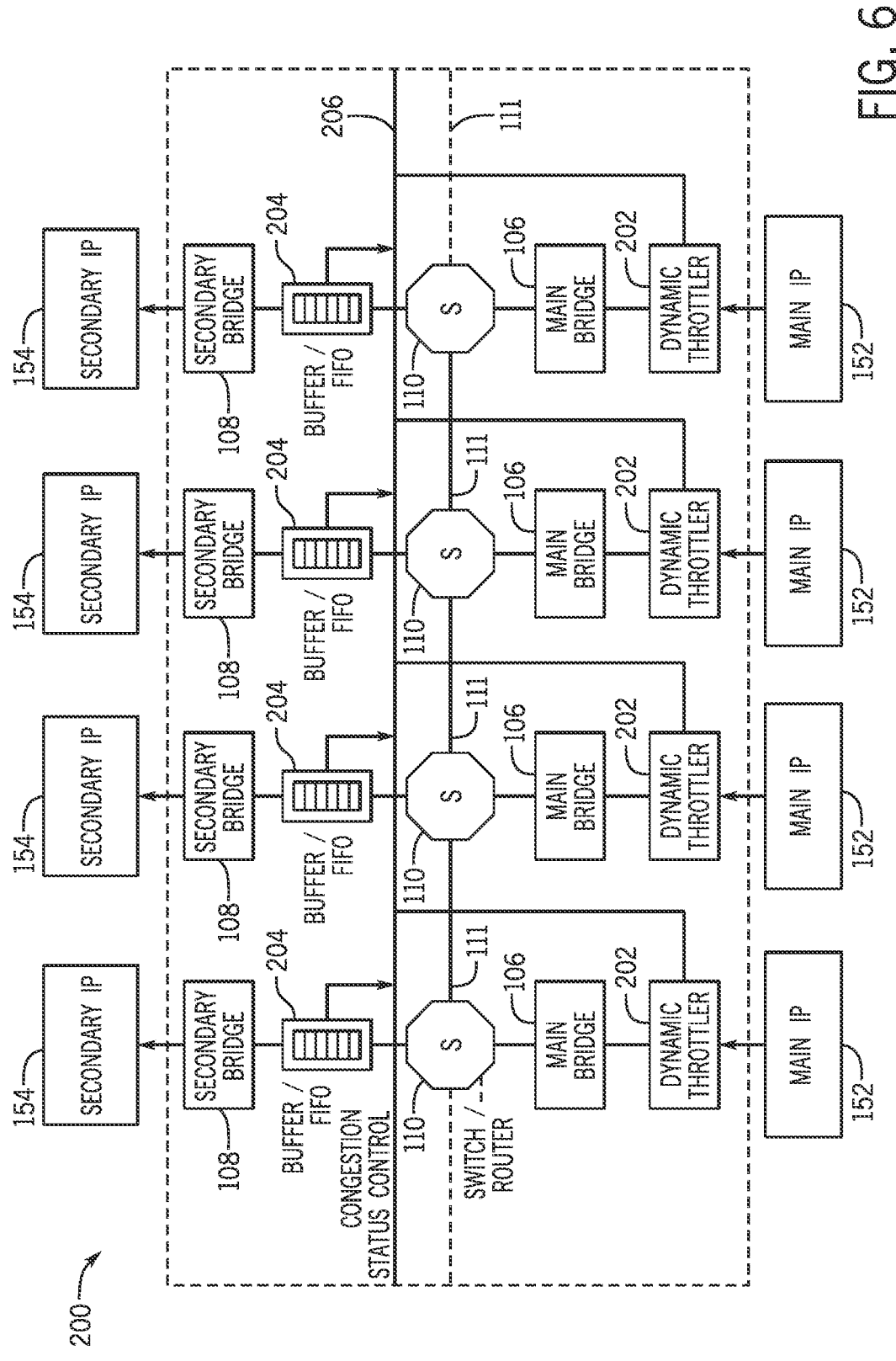
FIG. 6 is a schematic diagram of a system that may be implemented to alleviate congestion in the NoC of FIG. 4 via a dynamic throttler, in accordance with an embodiment of the present disclosure.

FIG. 6 is a schematic diagram of a system 200 that may be implemented to alleviate congestion and improve overall performance of the FPGA 102. The system 200 may include a portion of the NoC 104, including the main IP 152, the main bridges 106, the switches 110, the secondary bridges 108, and the secondary IP 154. The system 200 may also include a dynamic throttler 202 that may throttle (i.e., restrict) or increase a data injection rate from the main IP 152 to the rest of the system 200 (e.g., via the main bridge 106) based on feedback received from various components within the system 200. In particular, the dynamic throttler 202 may adjust the data injection rate based on indications of congestion in the main bridge 106 or a buffer 204. While the buffers 204 are illustrated as being disposed between the switches 110 and the secondary bridges 108, it should be noted that the buffers 204 may be disposed at any appropriate position in the system 200. For example, the buffers 204 may be disposed on the bus 206, on the links 111 between the switches, and so on. Moreover, multiple buffers 204 may be placed within the system 200. For example, a first buffer 204 may be disposed between the switch 110 and the secondary bridge 108 (as illustrated), while a second buffer 204 is disposed on the bus 206 and a third buffer 204 is disposed on the link 111.

Figure 7:
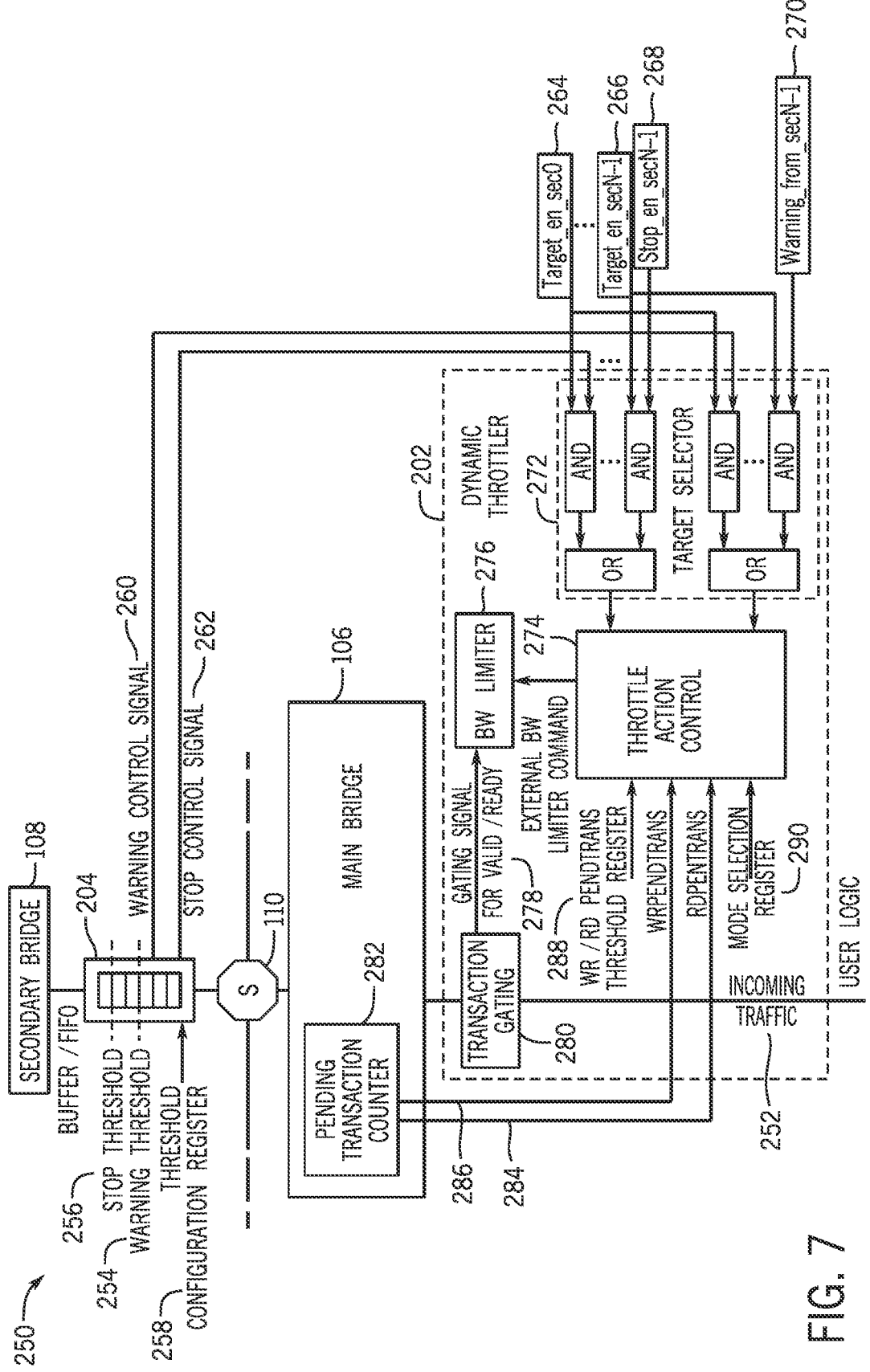
FIG. 7 is a schematic diagram of a traffic throttling feedback system including the dynamic throttler of FIG. 6, in accordance with an embodiment of the present disclosure.

FIG. 7 is a schematic diagram of a traffic throttling feedback system 250 uses the dynamic throttling performed by the dynamic throttler 202. The traffic throttling feedback system 250 includes the dynamic throttler 202 that may throttle or increase the injection rate of incoming traffic 252 (e.g., sourced from the main IP 152), the main bridge 106 that may receive the incoming traffic 252 and provide congestion feedback to the dynamic throttler 202, the switch 110 that may direct data from the main bridge 106 to a destination, the buffer 204 that may provide congestion feedback to the dynamic throttler 202, and the secondary bridge 108.

The dynamic throttler 202 may include a target selector 272 that may receive congestion control signals from the buffer 204 and, based on the particular control signals received from the buffer 204, may send throttling instructions to the throttle action control 274. The throttling instructions may include throttle rate instructions (e.g., based on whether the warning control signals 260 and/or the stop control signals 262 are asserted or deasserted) to reduce data injection rate, increase data injection rate, or stop data injection. The throttling instructions may also include target instructions, which may include identifiers (e.g., based on target enable signal 264 and 266 sent to the target selector from the secondary IP) for identifying which secondary IP is to have its incoming data increased, throttled, or stopped. The buffer 204 may be programmed (e.g., by a designer of the FPGA 102 or the system 100) with a warning threshold 254 and a stop threshold 256. For example, the warning threshold 254 may be set at 20% or more of total buffer depth of the buffer 204, 33.333% or more of total buffer depth of the buffer 204, 50% or more of total buffer depth of the buffer 204, and so on. Further, the warning threshold 254 may be set as a range. For example, the warning threshold may be set as the range from 25% of the total buffer depth to 75% of the total buffer depth of the buffer 204. Once the warning threshold 254 is reached, the buffer 204 may output a warning control signal 260 to the target selector 272 of the dynamic throttler 202 to slow traffic due to elevated congestion.

Similarly, the stop threshold 256 may be set at a higher threshold, such as 51% or more of total buffer depth of the buffer 204, 66.666% or more of total buffer depth of the buffer 204, 75% or more of total buffer depth of the buffer 204, 90% or more of total buffer depth of the buffer 204, and so on. Once the stop threshold 256 is reached, the buffer 204 may output a stop control signal 262 to the target selector 272. As will be discussed in greater detail below, the dynamic throttler 202 may apply a single throttle rate upon receiving the warning control signal 260 or may gradually increment the throttle rate (e.g., increase the throttle rate by an amount less than a maximum throttle rate, or adjusting throttle rate in multiple incremental increases) as the congestion in the buffer 204 increases. Once the dynamic throttler 202 receives the stop signal, the dynamic throttler 202 may stop all incoming data (e.g., may apply a throttle rate of 100%). The programmable stop threshold 256 and warning threshold 254 may be determined by a user and loaded into the buffer via a threshold configuration register 258.

In some embodiments, multiple secondary IP 154 may be communicatively coupled to multiple buffers 204, and multiple buffers 204 may communicate with multiple dynamic throttler 202. In this way, multiple dynamic throttlers 202 may have the ability to throttle data injection rates for multiple buffers 204 and multiple secondary IP 154. As such, the target selector 272 may receive feedback signals from multiple buffers 204 corresponding to multiple secondary IP 154. For example, the target selector 272 may receive the stop control signal 262 and a target enable signal 264 corresponding to a first secondary IP 154, indicating to the target selector 272 that the data being sent to the first secondary IP 154 is to be reduced or stopped completely according to the programmed stop threshold 256. The target selector 272 may also receive the warning control signal 260 and a target enable signal 266 corresponding to a second secondary IP 154, indicating to the target selector 272 that the data being sent to the second secondary IP 154 is to be reduced according to the warning threshold 254. The target selector 272 may send this information as a single signal to a throttle action control 274. In some embodiments, the target selector 272 may receive control signals from other secondary IP 154 in the NoC, such as the stop control signal 268 and the warning control signal 270. It should be noted that, while certain components (e.g., the throttle action control 274, the target selector 272) are illustrated as physical hardware components, they may be implemented as physical hardware components implementing software instructions or software modules or components. As used herein, a software module or component may include any type of computer instruction or computer-executable code located within a memory device and/or transmitted as electrical signals over a bus, wired connection, or wireless network executing on a processor physical components.

The throttle action control 274 may adjust throttling rate based on the status of the control signal from the target selector 272. The throttling rate may be programmable. For example, for the warning threshold 254, a designer may set a throttling rate of 5% or more, 10% or more, 25% or more, 50% or more, 65% or more, and so on. The dynamic throttler 202 may apply a single throttling rate or may set a range of throttling rates. For example, the dynamic throttler 202 may throttle the incoming traffic 252 at 10% at the lower edge of a range of the warning threshold 254 (e.g., as the buffer 204 fills to 25% of the buffer depth) and may increment (e.g., adjusting throttle rate in multiple incremental increases) the throttling rate until the throttling rate is at 50% at the upper edge of the range of the warning threshold 254 (e.g., as the buffer 204 fills to 50% of the buffer depth). In some embodiments, once the buffer 204 reaches the stop threshold 256, the data transfer may be stopped completely (e.g., throttling rate set to 100%). However, in other embodiments the data transfer may be significantly reduced, but not stopped, by setting a throttling rate of 75% or more, 85% or more, 95% or more, 99% or more, and so on.

Figure 8:
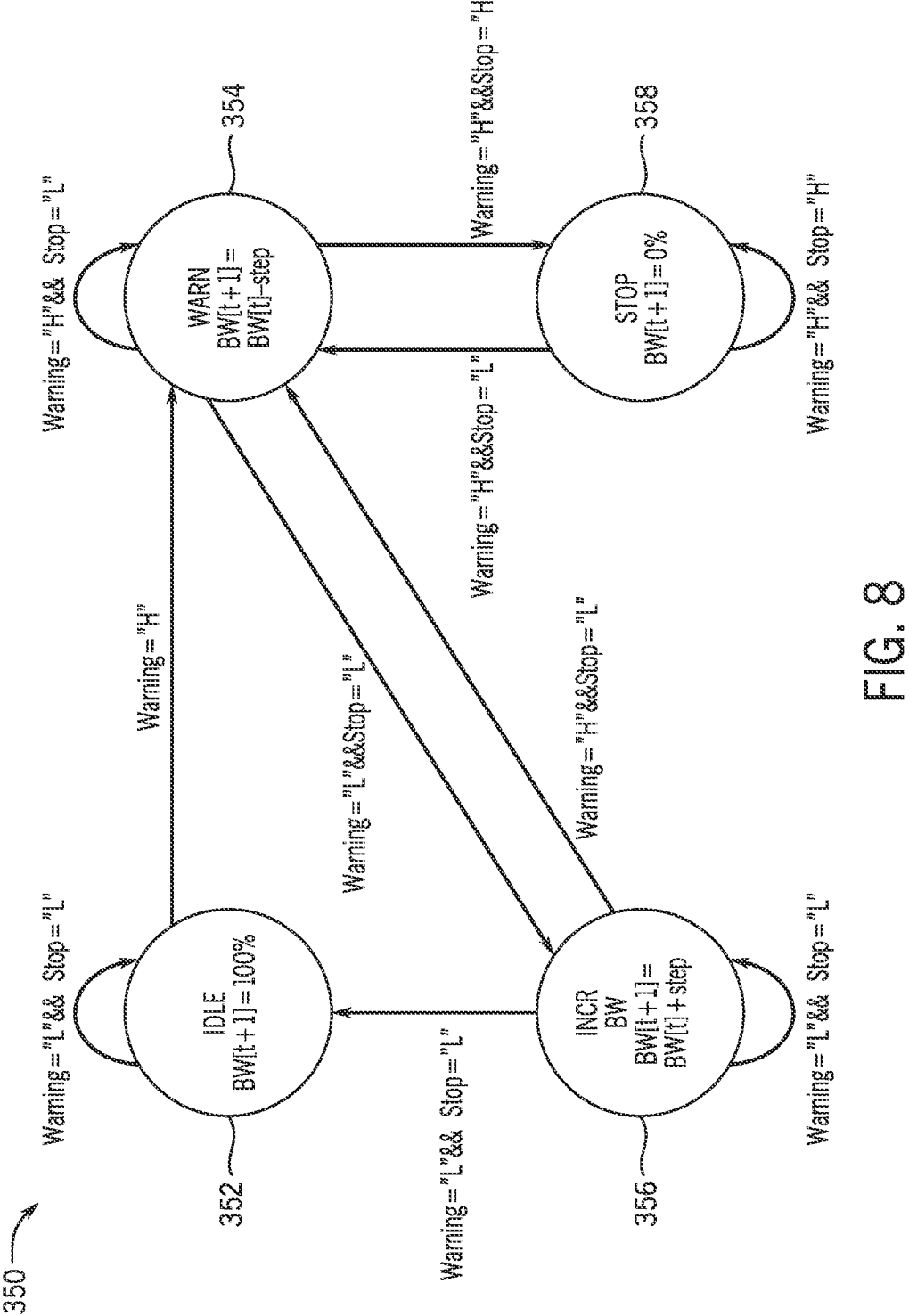
FIG. 8 is a diagram of a state machine illustrating throttling of incoming traffic by the dynamic throttler based on the feedback received from a buffer, in accordance with an embodiment of the present disclosure.

FIG. 8 is a diagram of a state machine 350 illustrating the throttling of the incoming traffic 252 by the dynamic throttler 202 based on the feedback received from the buffer 204. In an idle state 352, there may be no congestion or minimal congestion (e.g., congestion below the warning threshold 254) detected at the buffer 204. In the idle state 352, the dynamic throttler 202 may set the injection rate to enable full bandwidth (e.g., the throttle action control 274 may set the throttle rate to 0%) to pass to the main bridge 106. For example, if the warning threshold 254 is programmed at 50% and the buffer 204 is filled to 10% of the total buffer depth, the dynamic throttler 202 may occupy the idle state 352. If the warning control signal 260 and the stop control signal 262 are not asserted from the buffer 204, the dynamic throttler 202 may remain in the idle state 352.

If the dynamic throttler 202 receives from the buffer 204 an assertion of the warning control signal 260, the dynamic throttler 202 may enter a warning state 354. Continuing with the example above, if the warning threshold 254 is programmed at 50% of the total buffer depth, once the buffer 204 fills to 50% of the total buffer depth the buffer 204 may send the warning control signal 260 to the dynamic throttler 202. As previously discussed, the warning threshold 254 may be programmed for a range. For example, the warning threshold 254 may be programmed for the range from 25% of the total buffer depth to 50% of the total buffer depth.

In the warning state 354, the dynamic throttler 202 may reduce the injection rate below full bandwidth. In some embodiments, the dynamic throttler 202 may reduce the injection rate to a programmed warning throttle rate all at once (e.g., the throttle action control 274 may set the throttle rate to the programmed warning throttle rate, such as 50%). In other embodiments, the dynamic throttler 202 may gradually reduce the injection rate by incrementing the throttle rate (e.g., decrementing the injection rate) by a particular increment. The increment may be a 1% or greater increase in throttle rate, a 2% or greater in throttle rate, a 5% or greater increase in throttle rate, a 10% or greater increase in throttle rate, and so on. Continuing with the example above, if the warning threshold 254 is programmed for the range from 25% of the total buffer depth to 50% of the total buffer depth, the dynamic throttler 202 may gradually increment the throttle rate (i.e., decrement the injection rate) as the buffer fills from 25% to 50% of the total buffer depth of the buffer 204. By incrementing or decrementing the throttle rates/injection rate (e.g., by adjusting throttle rate in multiple incremental increases or decreases), the likelihood of causing instability in the dynamic throttler 202 may be reduced.

While in the warning state 354, if the dynamic throttler 202 receives an additional warning control signal 260 and does not receive a stop control signal 262, the dynamic throttler 202 may further reduce the injection rate (e.g., the throttle action control 274 may increase the throttle rate by a predetermined amount, such as increasing the throttle rate by 1%, 2%, 5%, 10%, and so on).

While in the warning state 354, if the dynamic throttler 202 does not receive the warning control signal 260 nor the stop control signal 262 (or receives a deassertion of the warning control signal 260 or the stop control signal 262), the dynamic throttler 202 may enter an increase bandwidth state 356. In the increase bandwidth state 356, the dynamic throttler 202 may increment the injection rate (i.e., decrement the throttle rate) of the incoming traffic 252 from the injection rate of the warning state. If, while in the increase bandwidth state 356, the dynamic throttler 202 receives an indication of a deassertion of the warning control signal 260 and/or the stop control signal and the injection rate is less than an injection rate threshold, the dynamic throttler 202 may remain in the increase bandwidth state and continue to increment the injection rate (e.g., until the injection rate meets or exceeds the injection rate threshold).

If, while in the increase bandwidth state 356, the dynamic throttler does not receive the warning control signal 260 nor the stop control signal 262 (or receives a deassertion of the warning control signal 260 or the stop control signal 262)

and the injection rate is greater than an injection rate threshold, the dynamic throttler 202 may reenter the idle state 352, and the injection rate may return to full capacity (e.g., the throttle action control 274 may decrease the throttle rate to 0%). However, if, while in the increase bandwidth state 356, the dynamic throttler receives an indication of an assertion of the warning control signal 260, the dynamic throttler 202 may reenter the warning state 354.

While in the warning state 354, if the dynamic throttler 202 receives an indication of an assertion of the stop control signal 262, the dynamic throttler may enter a stop state 358 and reduce the injection rate based on the stop threshold 256 (e.g., the throttle action control 274 may increase the throttle rate to 100%). While in the stop state 358, if the dynamic throttler 202 receives an indication of the assertion of the warning control signal 260 and the stop control signal 262, the dynamic throttler 202 may maintain a throttle rate of 100%. However, while in the stop state 358, if the warning control signal 260 remains asserted while the stop control signal 262, the dynamic throttler 202 may reenter the warning state 354 may reduce the throttling rate accordingly. For example, the throttle action control 274 may reduce the throttle rate to the programmed warning throttle rate, such as 50%.

Returning to FIG. 7, the dynamic throttler 202 may also adjust throttling rate based on feedback from the main bridge 106. The feedback may include a number of pending transactions being processed in the main bridge 106. The main bridge 106 may include a pending transaction counter 282 that tracks the number of pending transactions in the main bridge 106. As pending transactions enter the main bridge 106, the pending transaction counter 282 may increase the number of pending transactions and report the number of pending transactions to the throttle action control 274 via a read pending transaction control signal 284 and/or a write pending transaction control signal 286. As the main bridge 106 processes the transactions and passes the transactions to the switch 110, the pending transaction counter 282 may decrease the number of pending transactions and report the updated number of pending transactions to the throttle action control 274 via the read pending transaction control signal 284 and/or the write pending transaction control signal 286. As such, a larger number of pending transactions indicates greater congestion at the main bridge 106, and a smaller number of pending transactions indicates lesser congestion at the main bridge 106.

As with the warning threshold 254 and the stop threshold 256 for the buffer 204, a warning threshold and a stop threshold for the pending transactions in the main bridge 106 may be programmable. For example, a user may set a warning threshold corresponding to a first number of pending transactions, and once the pending transaction counter 282 reaches the first number, the dynamic throttler 202 may throttle the incoming traffic 252 such that the transaction gating circuitry 280 receives fewer incoming transactions. A user may also set a stop threshold corresponding to a second number of pending transactions, and once the pending transaction counter 282 reaches the second number, the dynamic throttler 202 may throttle the incoming traffic 252, stopping or significantly limiting the number transactions entering the transaction gating circuitry 280.

The warning and stop thresholds for pending transactions may be loaded into the throttle action control 274 from a write/read pending transaction threshold register 288. Based on the number of pending transactions reported by the pending transaction counter and the warning and stop thresholds, the mode (e.g., the transaction throttling rate)

may be selected based on a value loaded into the throttle action control 274 via a mode selection register 290 that may indicate whether dynamic throttling is enabled for the integrated circuit 12. As with the throttling based on the feedback from the buffer 204, the throttling rate based on the pending transactions in the main bridge 106 may be a single throttling rate or may be a range of throttling rates incremented over a programmable range of pending transactions thresholds.

Once the number of pending read and write transactions is received from the pending transaction counter 282 and the mode is selected by the mode selection register 290, the throttle action control 274 may determine the amount of incoming transactions to limit. The throttle action control 274 may send instructions on the amount of incoming transactions to limit to a bandwidth limiter 276. The bandwidth limiter 276 may control how long to control the gating mechanism of the transaction gating circuitry 280. Based on the instructions received from the throttle action control 274, the bandwidth limiter 276 may cause the transaction gating circuitry 280 to receive or limit the incoming transactions. It should be noted that, while certain components (e.g., the bandwidth limiter 276) are illustrated as physical hardware components, they may be implemented as physical hardware components implementing software instructions or software modules or components.

Figure 9:
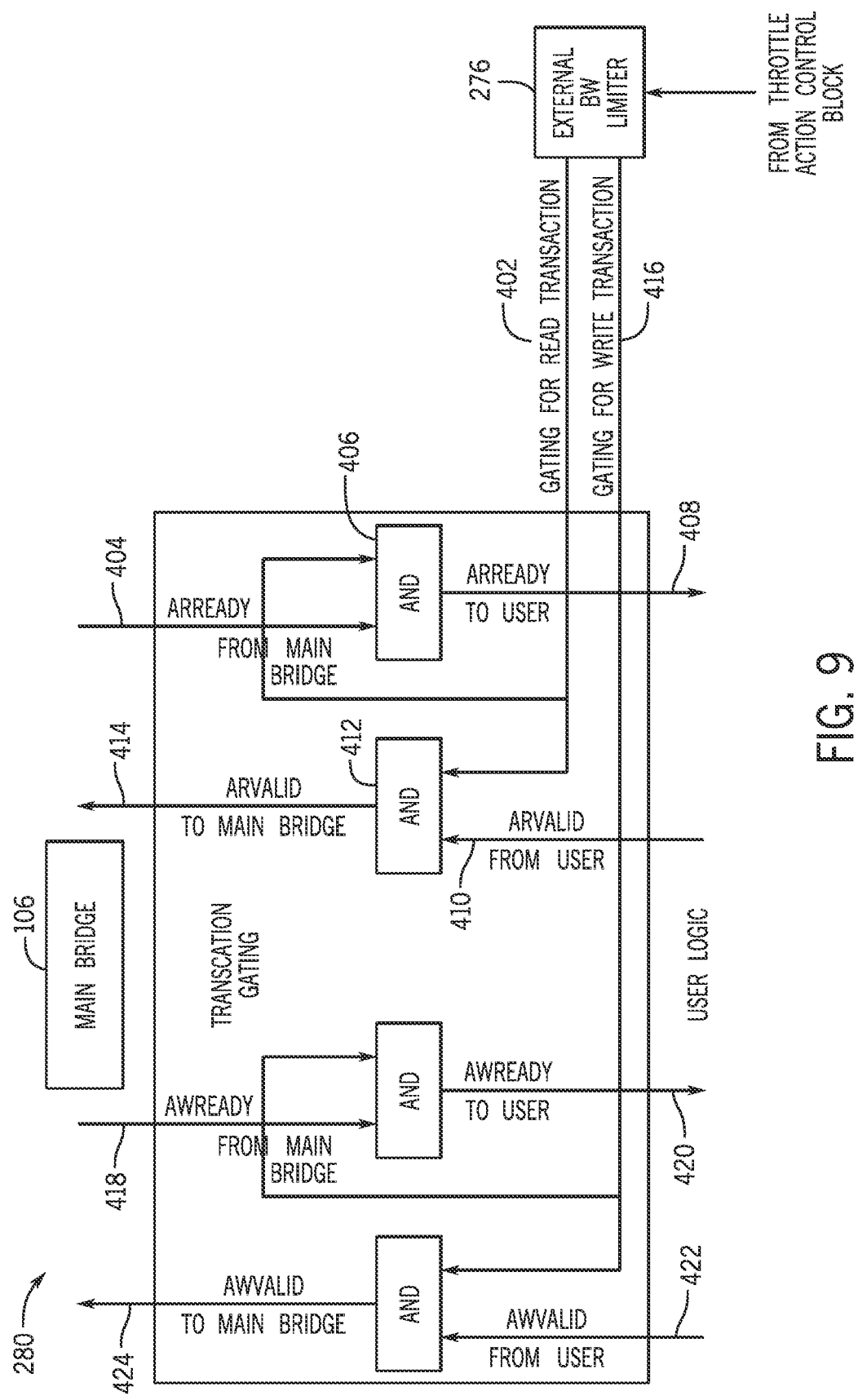
FIG. 9 is a detailed schematic view of transaction gating circuitry, in accordance with an embodiment of the present disclosure.

FIG. 9 is a detailed schematic view of the transaction gating circuitry 280. In the transaction gating circuitry 280, the read valid signals ARVALID 410, ARVALID 414, the write valid signals AWVALID 422, and AWVALID 424, the read ready signals ARREADY 404 and ARREADY 408, and the write valid signals AWREADY 418, and AWREADY 420 may be set to high or low to gate the transaction gating circuitry 280 for a programmable period of time. By gating the transaction gating circuitry 280, the dynamic throttler 202 may reduce the data injection rate of the incoming traffic 252.

When the pending transaction counter 282 indicates that the number of pending transaction is high (e.g., indicating congestion at the main bridge 106), the bandwidth limiter 276 may set the read and write signals low (e.g., the gating for read transaction signal 402 may be set to low and the gating for write transactions signal 416 may be set to low), thus the ready signals ARREADY 408, and AWREADY 420 may be low, the valid signals ARVALID 414 and AWVALID 424 may be low, and the main bridge 106 may not accept incoming read/write transactions. As a result, the injection rate of the incoming traffic 252 is reduced.

When the pending transaction counter 282 indicates that the number of pending transaction is low (e.g., indicating little or no congestion at the main bridge 106), the bandwidth limiter 276 may set the read and write signals high (e.g., the gating for read transaction signal 402 may be set to high and the gating for write transactions signal 416 may be set to high), thus the ready signals ARREADY 408, and AWREADY 420 may be high, the valid signals ARVALID 414 and AWVALID 424 may be high, and the main bridge 106 may accept incoming read/write transactions. As a result, the traffic injection bandwidth will be high, and the transaction gating circuitry 280 may transmit the incoming traffic 252 to the main bridge 106.

Figure 10:
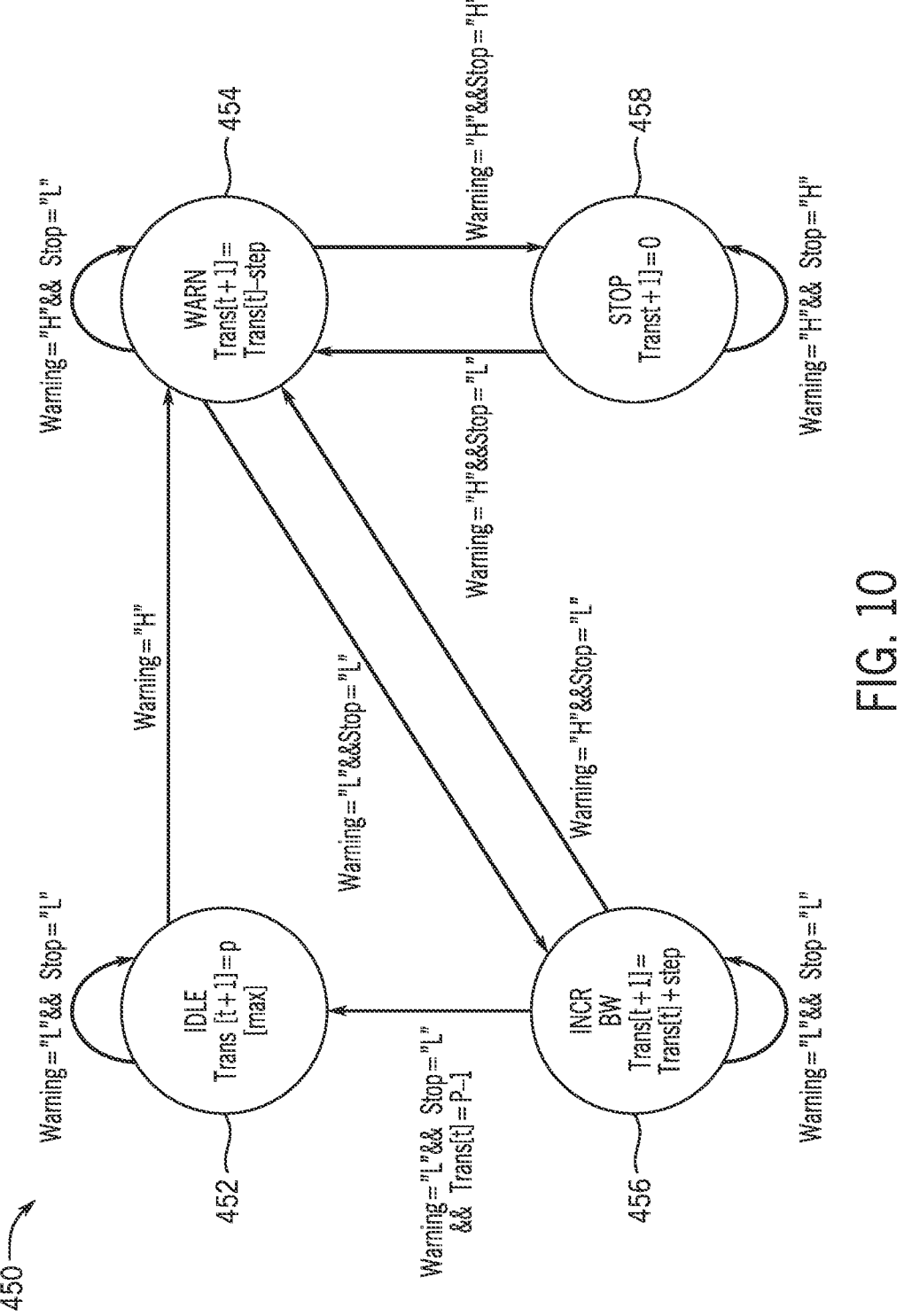
FIG. 10 is a diagram of a state machine illustrating the throttling of the incoming traffic by the dynamic throttler based on a number of transactions pending at a main bridge, in accordance with an embodiment of the present disclosure.

FIG. 10 is a diagram of a state machine 450 illustrating the throttling of the incoming traffic 252 by the dynamic throttler 202 based on the feedback received from the pending transaction counter 282 of the main bridge 106. In an idle state 452, there may be no congestion or minimal congestion (e.g., congestion below a programmable warning threshold)

detected at the main bridge 106. In the idle state 452, the dynamic throttler 202 may enable the maximum number of transactions to enter the main bridge 106 (e.g., the throttle action control 274 may set the throttling rate for the incoming transactions to 0%) to pass to the main bridge 106. If the dynamic throttler 202 receives an indication of a deassertion of the warning control signal and/or the stop control signal from the main bridge 106 (e.g., the pending transaction counter 282 of the main bridge 106), the dynamic throttler 202 may remain in the idle state 352.

If the dynamic throttler 202 receives from the main bridge 106 an assertion of the warning control signal, the dynamic throttler 202 may enter a warning state 454. In the warning state 454, the dynamic throttler 202 may increase the gating of the transaction gating circuitry 280 to reduce the injection rate of the transactions entering the main bridge 106. In some embodiments, the dynamic throttler 202 may reduce the injection rate to a programmed warning throttle rate all at once. For example, once the number of pending transactions received from the pending transaction counter 282 reaches a first threshold, the throttle action control 274 may set the throttling rate to a programmed warning throttling rate to throttle 50% of the transactions coming from the incoming traffic 252. In other embodiments, the dynamic throttler 202 may gradually reduce the injection rate by incrementing the throttle rate (e.g., decrementing the injection rate) by a particular increment. The increment may be a 1% or greater increase in throttling rate of incoming transactions, a 2% or greater in throttle rate of incoming transactions, a 5% or greater increase in throttle rate of incoming transactions, a 10% or greater increase in throttle rate of incoming transactions, and so on. By incrementing or decrementing the throttle rates/injection rate, the likelihood of causing instability in the dynamic throttler 202 may be reduced.

While in the warning state 454, if the dynamic throttler 202 receives an additional indication of an assertion of the warning control signal and does not receive a stop control signal (e.g., receives an indication of a deassertion of the stop control signal), the dynamic throttler 202 may further reduce the injection rate of the incoming transactions (e.g., the throttle action control 274 may increase the throttle rate by a predetermined amount, such as increasing the throttle rate by 1%, 2%, 5%, 10%, and so on).

While in the warning state 454, if the dynamic throttler 202 receives an indication of a deassertion of the warning control signal and/or the stop control signal, the dynamic throttler 202 may enter an increase transaction state 456. In the increase transactions state 456, the dynamic throttler 202 may increment the injection rate of the transactions in the incoming traffic 252 from the injection rate of the warning state 454. If, while in the increase transactions state 456, the dynamic throttler 202 receives an indication of a deassertion of the warning control signal and/or the stop control signal and the injection rate is less than an injection rate threshold, the dynamic throttler 202 may remain in the increase transactions state 456 and continue to increment the injection rate (e.g., until the injection rate meets or exceeds the injection rate threshold).

If, while in the increase transactions state 456, the dynamic throttler receives an indication of a deassertion of the warning control signal and/or the stop control signal and the injection rate is greater than an injection rate threshold, the dynamic throttler 202 may reenter the idle state 452. In the idle state 452, the injection rate may return to full capacity (e.g., the throttle action control 274 may decrease the throttle rate for incoming transactions to 0%). However, if, while in the increase transactions state 456, the dynamic throttler receives an indication of an assertion of the warning control signal, the dynamic throttler 202 may reenter the warning state 454.

While in the warning state 454, if the dynamic throttler 202 receives an indication of an assertion of the warning control signal and the stop control signal, the dynamic throttler may enter a stop state 458 and reduce the injection rate of the incoming transactions based on the stop threshold (e.g., the throttle action control 274 may increase the throttle rate to 100%). While in the stop state 458, if the dynamic throttler 202 receives the warning control signal and/or the stop control signal, the dynamic throttler 202 may maintain a throttle rate of 100%. However, while in the stop state 458, if the dynamic throttler 202 receives an indication of an assertion of the warning control signal and an indication of a deassertion of the stop control signal, the dynamic throttler 202 may reenter the warning state 454, and the dynamic throttler 202 may reduce the throttling rate accordingly.

Programmable Address Remapping

Figure 11:
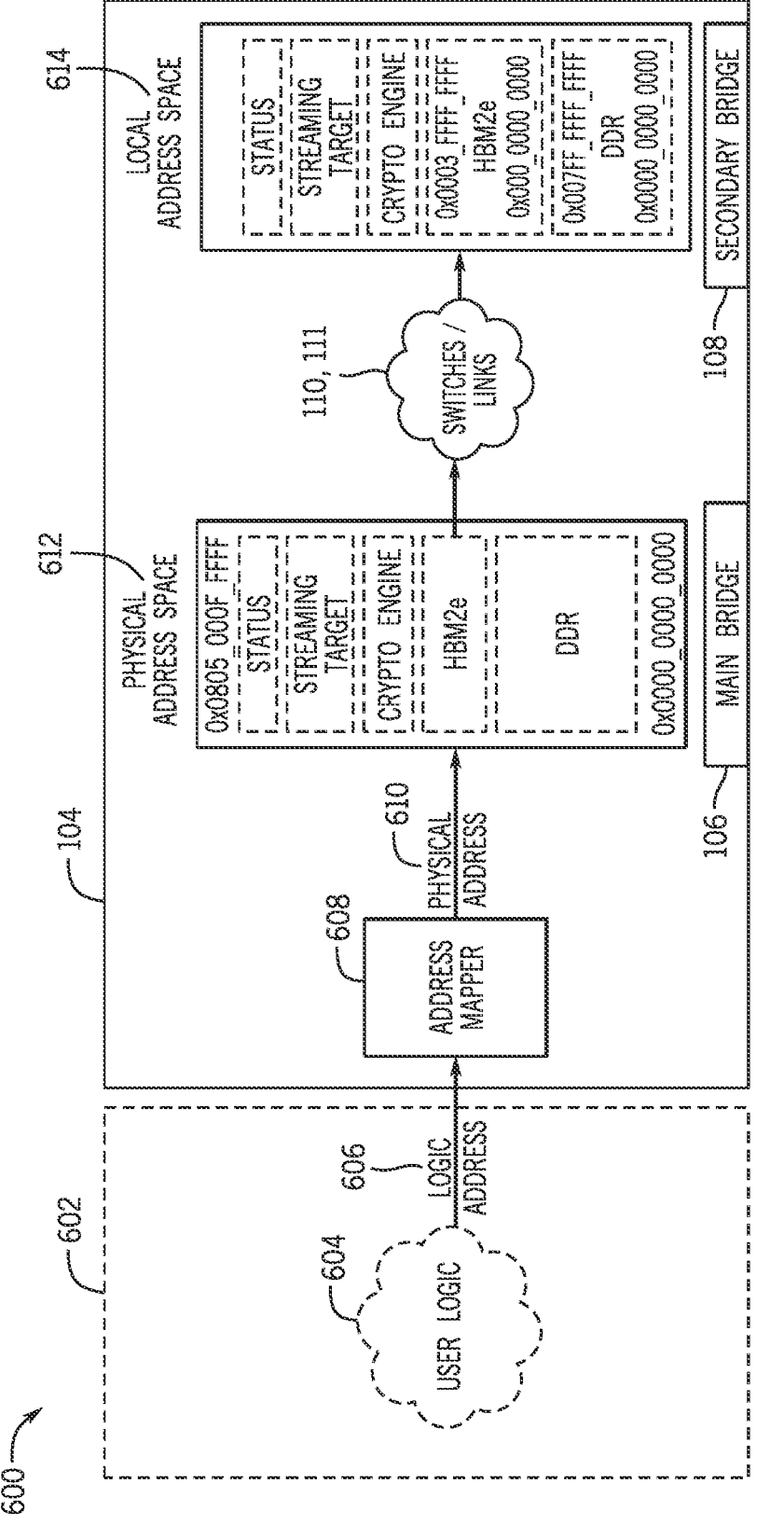
FIG. 11 is a diagram of a system illustrating how a logical address may be mapped to a physical address using an address mapper, in accordance with an embodiment of the present disclosure.

As previously stated, congestion may accrue on the NoC 104 as a result of multiple main IP 152 being mapped to multiple secondary IP 154. FIG. 11 is a diagram of a system 600 illustrating how a logical address may be mapped to a physical address. The system 600 may include FPGA programmable logic fabric 602 that may include user logic 604 (e.g., such as the host program 22). The user logic 604 may utilize a logical address 606. The logical address 606 may also be referred to as a system address and can be viewed by a user of the FPGA 102. The NoC 104 may include an address mapper 608 that may map the logical address 606 to a physical address 610. The physical address 610 may refer to a location of physical address space 612 (e.g., located at the main IP 152 or the main bridge 106). Upon accessing the physical address space 612, the physical address 610 may point to a local address space 614 (e.g., of the secondary IP 154 or the secondary bridge 108) via the switches 110 and the links 111.

Figure 12:
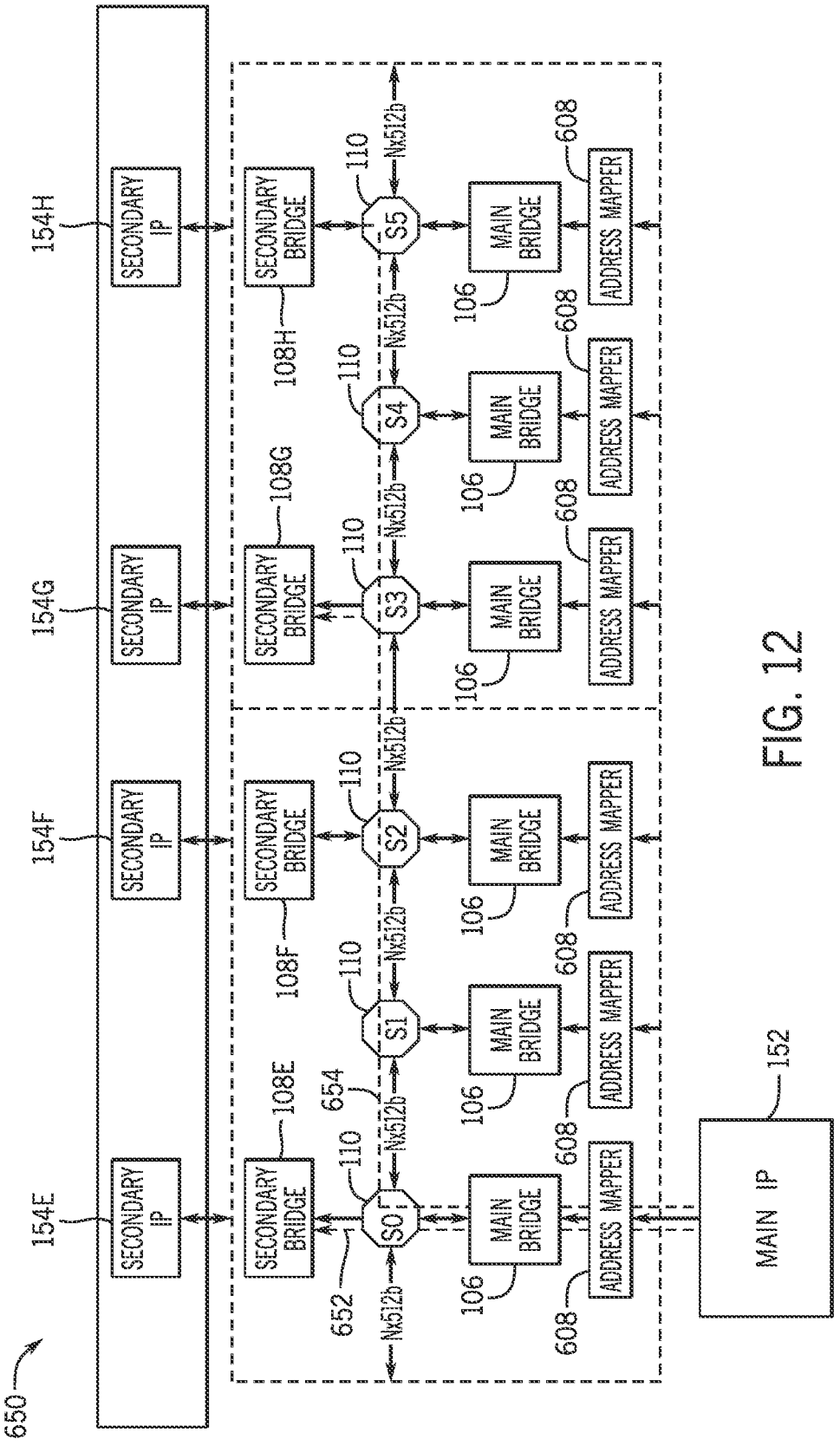
FIG. 12 is a diagram of a system including the address mapper of FIG. 11 implemented in the NoC, in accordance with an embodiment of the present disclosure.

FIG. 12 is a diagram of a system 650 including the address mapper 608 implemented in the NoC 104. In the system 650, main IP 152 (e.g., the user logic 604) may be mapped to a secondary IP 154E, 154F, 154G, or 154H (collectively referred to herein as the secondary IP 154). However, if congestion develops at one of the secondary bridges 108E, 108F, 108G, and/or 108H (collectively referred to herein as the secondary bridges 108) or one of the secondary IP 154E, 154F, 154G, and/or 154H. As congestion develops at one or more of the secondary bridges 108 or one or more of the secondary IP 154, it may be advantageous to remap the logical address 606 from a physical address 610 associated with one of the congested destinations to a to another physical address 610 associated with a less congested destination. The address mapper 608 may be implemented in hardware, and thus may not consume any programmable logic of the FPGA 102 and may not cause any time delay associated with performing similar operations in soft logic.

For example, the main IP 152 may have an associated logical address 606 that may be mapped by the address mapper 608 to the secondary IP 154E. However, if congestion develops at the secondary IP 154E or the secondary bridge 108E, the address mapper 608 may remap the logical address 606 of the main IP 152 to a destination that has little or no congestion, such as the secondary IP 154H.

Figure 13A:
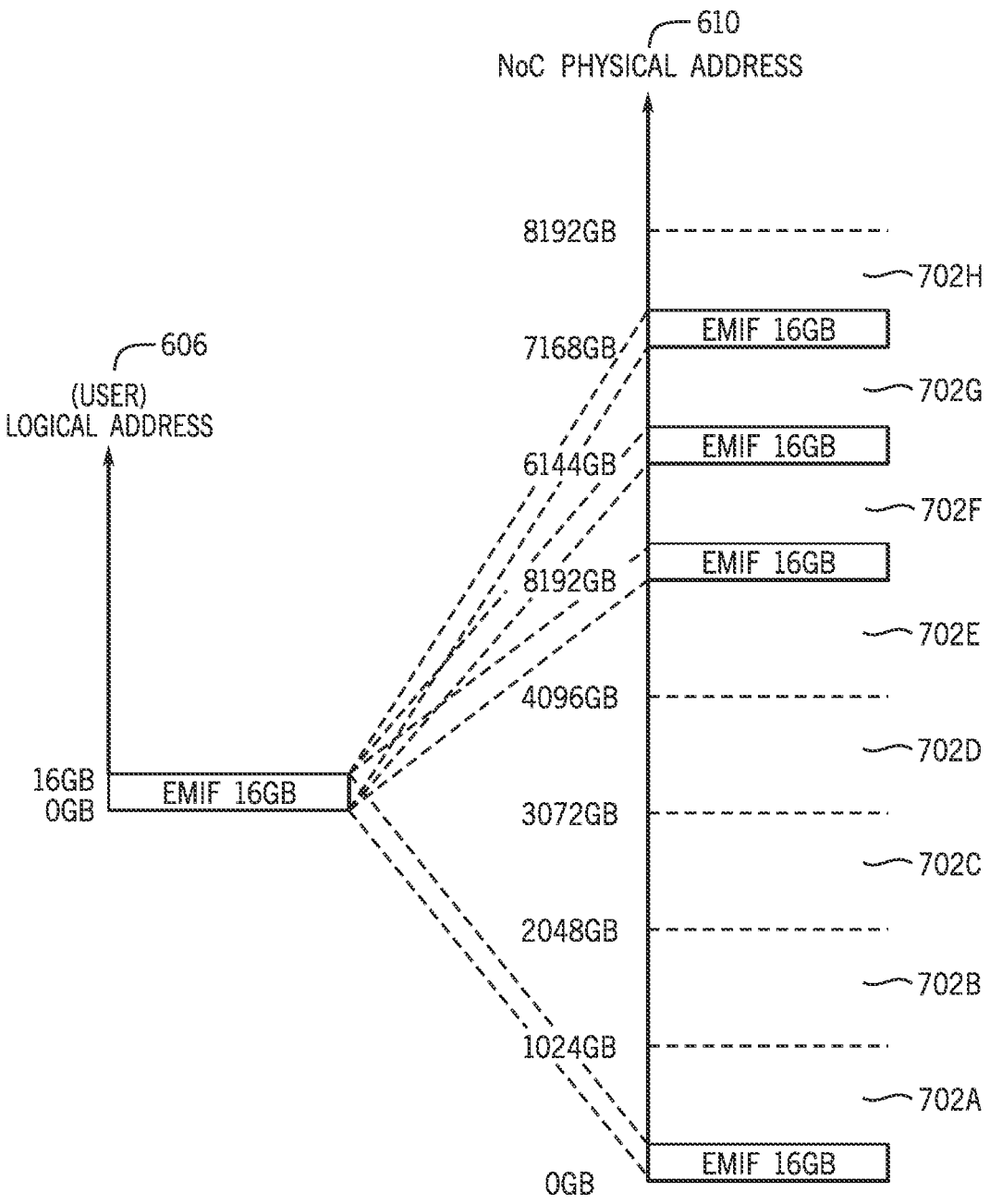
FIG. 13A is a diagram illustrating how a logical address may be mapped to various physical addresses via the address mapper of FIG. 11, in accordance with an embodiment of the present disclosure.

FIG. 13A is a diagram illustrating how logical addresses may be mapped to physical addresses. The logical address 606 may be mapped to a physical address 610 in any one of entries 702A, 702B, 702C, 702D, 702E, 702F, 702G, or 702H (collectively referred to herein as the entries 702). As may be observed, the entries 702 may each include a region size of 1024 gigabytes (GB) wide. This is because the memory type is External Memory Interface (EMIF) DDR that includes a maximum region size of 1024 GB. However, the data mapped to the entries 702 may not consume all 1024 GB (i.e., may be less than 1024 GB). FIG. 13B is a table 704 illustrating how different memory types may be mapped to different addresses of different maximum sizes. While the table 704 illustrates addresses for memory types DDR, HBM, and AXI-Lite, these are merely illustrative, and the address mapper 608 may support any appropriate type of memory.

Figure 14:
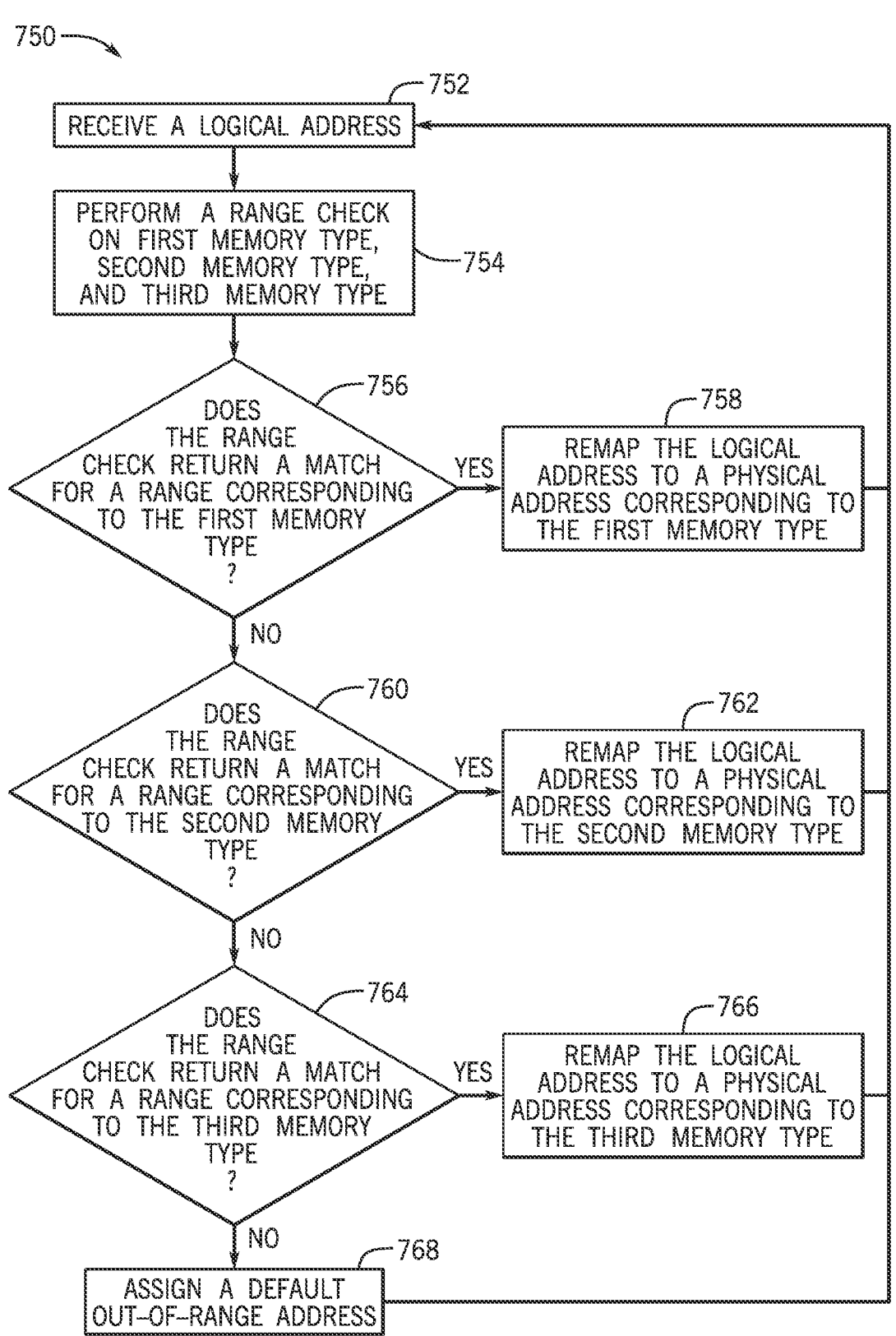
FIG. 14 is a flowchart of a method illustrating the operation of the address mapper of FIG. 11, in accordance with an embodiment of the present disclosure.

FIG. 14 is a flowchart of a method 750 illustrating the operation of the address mapper 608. In process block 752 the address mapper 608 receives a logical address (e.g., logical address 606). The logical address may be received from the main IP 152. As different secondary IP 154 may have different address ranges, in process block 754, the address mapper 608 may perform a range check on a first memory type, a second memory type, and a third memory type. The address mapper 608 may perform the range check by looking at the incoming logical address, comparing the logical address with physical addresses of the various types of memory, and determining if the logical address corresponds to a physical address in a range corresponding to any of the three memory types. It should be noted that, while three different types of memory are discussed here, this is merely exemplary, and there may be any appropriate number of memory types.

In query block 756, the address mapper 608 determines if the range check returns a match for a range corresponding to the first memory type. The address mapper 608 may perform the range check on the first memory type. If the range check returns a match for a range corresponding to the first memory type, then in process block 758, the address mapper 608 may remap the logical address to a physical address corresponding to the first memory type. If the range check does not return a match for a range corresponding to the first memory type, then in query block 760, the address mapper 608 determines if the range check returns a match for a range corresponding to the second memory type. If the range check returns a match for a range corresponding to the second memory type, then, in process block 762, the address mapper 608 may remap the logical address to a physical address corresponding to the second memory type.

If the range check does not return a match for a range corresponding to the first memory type or the second memory type, then in query block 764, the address mapper 608 determines if the range check returns a match for a range corresponding to the third memory type. If the range check returns a match for a range corresponding to the third memory type, then, in process block 766, the address mapper 608 may remap the logical address to a physical address corresponding to the third memory type. However, if the range check does not return a match for a range corresponding to the first memory type, the second memory type, nor the third memory type, the address mapper 608 may assign a default out-of-range address in block 768, which may generate a user-readable error message.

Figure 15:
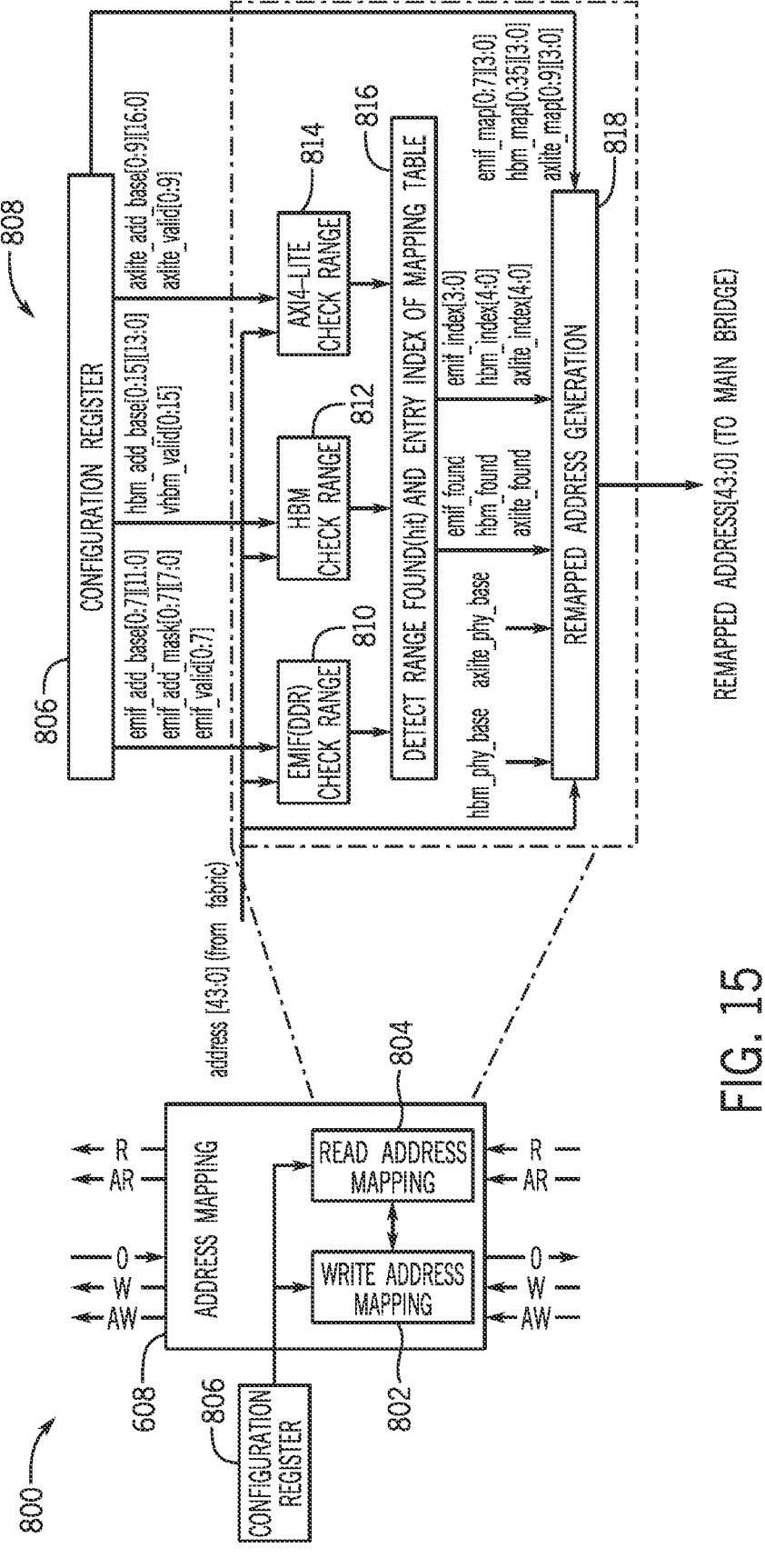
FIG. 15 is a detailed schematic diagram illustrating an example of the operation of the address mapper as described in the method of FIG. 14, in accordance with an embodiment of the present disclosure.

FIG. 15 is a detailed block diagram 800 illustrating an example of the operation of the address mapper 608 as described in the method 750. The address mapper 608 may include read address mapping circuitry 804 and a write address mapping circuitry 802. It should be noted that, while certain components (e.g., the read address mapping circuitry 804 and the write address mapping circuitry 802) are illustrated as physical hardware components, they may be implemented as physical hardware components implementing software instructions or software modules or components. A configuration register 806 may load data relating to the three types of memory into the write address mapping circuitry 802, the read address mapping circuitry 804, or both. In the exemplary embodiment of FIG. 15, the three types of memory are DDR memory, high-bandwidth memory (HBM), and AXI4-Lite memory. The data loaded by the configuration register 806 may include, for each memory type, an address base, an address mask, and an address valid. The data loaded by the configuration register 806 may be obtained from one or more remapping tables.

The address mapper 608 may perform range checks on the different types of memory used in the address mapper 608 (e.g., as described in the method 750 above). As may be observed, the range checks for DDR memory (e.g., as described in the query block 756) may be performed by DDR range check circuitry 810, the range checks for HBM memory (e.g., as described in the query block 760) may be performed by the HBM range check circuitry 812, and the range checks for AXI4-Lite memory (e.g., as described in the query block 764) may be performed by the AXI4-Lite range check circuitry 814.

For example, the DDR range check circuitry 810 may perform a range check for DDR. If the address mapper 608 detects a DDR memory range match (i.e., a range hit) in the circuitry 816, the matching range may be sent to the remapping circuitry 818 and the logical address may be remapped to a physical address of the DDR memory. If there is no range hit for the DDR memory range, the HBM range check circuitry 812 may perform a range check for HBM memory. If the circuitry 816 detects an HBM memory range hit, the matching range may be sent to the remapping circuitry 818 and the logical address may be remapped to a physical address of the HBM memory.

If there is no range hit for the DDR memory range nor the HBM memory range, the AXI4-Lite range check circuitry 814 may perform a range check for the AXI4-Lite memory. If the circuitry 816 detects an AXI4-Lite memory range hit, the matching range may be sent to the remapping circuitry 818 and the logical address may be remapped to a physical address of the AXI4-Lite memory. If there is no range hit for the DDR memory range, the HBM memory range, nor the AXI4-Lite memory range, the address mapper 608 may assign a default out-of-range address in block 768, which may generate a user-readable error message. While FIG. 15 is discussed in terms of circuitry and other physical components, it should be noted that certain components (e.g., the DDR range check circuitry 810, the HBM range check circuitry 812, the AXI4-Lite range check circuitry 814, the circuitry 816, the remapping circuitry 818) may be implemented as a combination of software and hardware components or implemented entirely in software.

FIG. 16 is an example of a DDR remapping table 850 for remapping DDR addresses. The DDR remapping table may include a lookup table that includes memory address information such as DDR entry identifier 852, DDR address base 854, DDR mapping data 856, DDR address mask 858, and DDR address valid 860 fields. In some embodiments, the DDR entry identifier 852 may indicate one of many segments in a single DDR memory device while in other embodiments the DDR entry identifier 852 may indicate one of a variety of DDR memory devices. The DDR address base 854 may indicate an offset of the logical address and may be used as a comparison against the incoming logical address. The DDR address mask 858 may indicate memory size that is supported by a particular secondary IP 154 (e.g., a memory controller). The DDR address valid 860 may indicate whether a memory entry is valid, such that if the DDR address valid 860 is set to high, the entry may be activated for comparison (e.g., in the range check), and if the DDR address valid 860 is set to low, the entry may not be activated for comparison. The DDR mapping data 856 may be used to remap the logical address. Secondary IP 154 such as DDR memory may utilize the DDR address mask 858, as DDR memory may range from 4 GB to 1024 GB. The DDR address mask 858 may set the size used by a DDR memory controller by selecting a DDR address space, as is shown in Table 1 below.

TABLE 1

| Configurable Address Space for DDR (EMIF) | |
| emif_addr_mask [7:0] | DDR address space (GB) |
| --- | --- |
| 8'b0000_0000 | 1024 |
| 8'b0000_0001 | 512 |
| 8'b0000_0011 | 256 |
| 8'b0000_0111 | 128 |
| 8'b0000_1111 | 64 |
| 8'b0001_1111 | 32 |
| 8'b0011_1111 | 16 |
| 8'b0111_1111 | 8 |
| 8'b1111_1111 | 4 |

FIG. 17 is an example of an HBM remapping table 900. The HBM remapping table 900 may include a lookup table that includes memory address information such as HBM entry identifier 902, HBM address base 904, HBM mapping data 906, and HBM valid 908 fields. The HBM address base 904 may indicate an offset of the logical address and may be used as the comparison against the incoming logical address. The HBM valid 908 may indicate whether a memory entry is valid. The HBM mapping data 906 may indicate a specific location within the HBM memory space. The HBM remapping table 900 does not include an address mask as HBM memory does not have a maximum configurable address size. All HBM memory may include an address size of 1 GB.

If the range check does not return a match for a range corresponding to the first memory type and the second memory type, then in query block 764, the address mapper 608 determines if the range check returns a match for a range corresponding to the third memory type. If the range check returns a match for a range corresponding to the third memory type, then, in process block 766, the address mapper 608 may remap the logical address to a physical address corresponding to the third memory type. In the example illustrated in FIG. 15, the address mapper 608 may detect a match (i.e., a range hit) in the circuitry 816. The matching range may be sent to the remapping circuitry 818 and the logical address may be remapped to a physical address of the third memory type (e.g., the AXI4-Lite memory). However, if the range check does not return a match for a range corresponding to the first memory type, the second memory type, nor the third memory type, the address mapper 608 may assign a default out-of-range address in process block 768, which may generate a user-readable error message.

Figure 18:
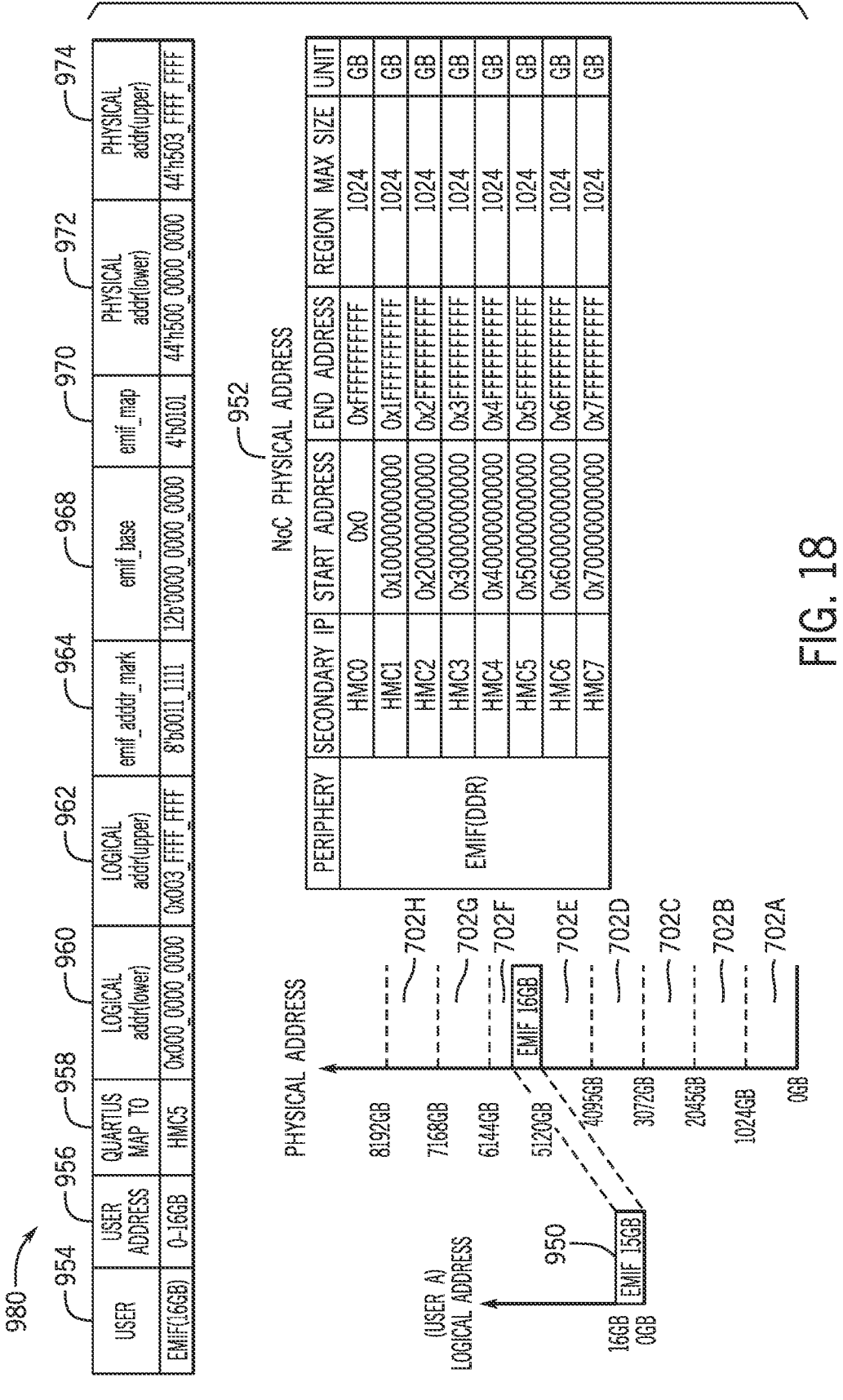
FIG. 18 illustrates an example of mapping a logical address to a DDR memory physical address via the address mapper of FIG. 11, in accordance with an embodiment of the present disclosure.

FIG. 18 illustrates an example of mapping a logical address to a DDR memory physical address via the address mapper 608. In FIG. 18, the logical address 950 may include a 16 GB DDR address that is mapped to the entry 702F. The entry 702F may include a memory size of 1024 GB and range from 5120 GB to 6144 GB. The table 980 includes information relating to the mapping process. The user identifier 954 may indicate the type of and size of the memory of the logical address. In this example, the user identifier 954 identifies 16 GB EMIF (DDR) memory. The user address 956 identifies the logical address. The secondary IP map 958 identifies the secondary IP 155 to which the logical address 606 may be mapped. As may be observed, the entry 702F corresponds to the secondary IP identifier HMC5. The lower logical address 960 and the upper logical address 962 may include values specified by the user/user logic. The address mask 964, the address base 968 and the mapping data 970 may work as explained in FIG. 14-FIG. 17. Based on the physical address identified by the address mapper 608 (e.g., as described in FIG. 14-FIG. 17), the address mapper 608 may determine the lower physical address 972 and the upper physical address 974 as the bounds to which the logical address 606 may be mapped.

FIG. 19 illustrates another example of mapping multiple logical addresses to multiple physical addresses corresponding to multiple types of secondary IP. In this example, a user/user logic may map multiple logical addresses 1002, 1004, and 1006 to multiple physical addresses. The logical address 1002 may include 1 GB of HBM memory at the user address 956 of 33 GB-34 GB, the logical address 1004 may include 16 GB of DDR memory at the user address 956 of 16 GB-32 GB, and the logical address 1006 may include 1 GB of HBM memory at the user address 956 of 0 GB-1 GB.

Similar to the example in FIG. 18, the logical address 1004 is mapped to a DDR physical address. As may be observed from the table 1010, the logical address 1004 is mapped to the secondary IP HMC5 corresponding to the entry 702F. As such, the values corresponding to the logical address 1004 in the table 1012 will be the same as the values in the table 980 in FIG. 18, with the exception of the address base 968. In the example illustrated in FIG. 19, the logical address 1004 includes the user address 956 of 16 GB-32 GB. The address base 968 reflects this offset in the value 12'b0000_0000_0100, which represents the value of 16 in hexadecimal, in contrast to the address base 968 in FIG. 18 of 12b'000_0000_0000, representing the value of 0 in hexadecimal.

As may be observed, the logical address 1002 is mapped to the entry 1008C, corresponding to the secondary IP PC2 illustrated in table 1010. Similarly, the logical address 1006 is mapped to the entry 1008D, corresponding to the secondary IP PC3 illustrated in the table 1010. For example, the secondary IP PC2 and the secondary IP PC3 may include multiple HBM memory controllers. Using the lower logical address 960 and the upper logical address 962 keyed in by the user, the address mapper 608 may determine the values for the address base 968 and the address mapping data 970 using the systems and methods described in FIG. 14-FIG. 17. Using the address base 968 and the address mapping data 970, the address mapper 608 may map the logical addresses 1002 and 1006 to a physical address indicated by the lower physical address 972 and the upper physical address 974.

Data Width Adapter

Figure 20:
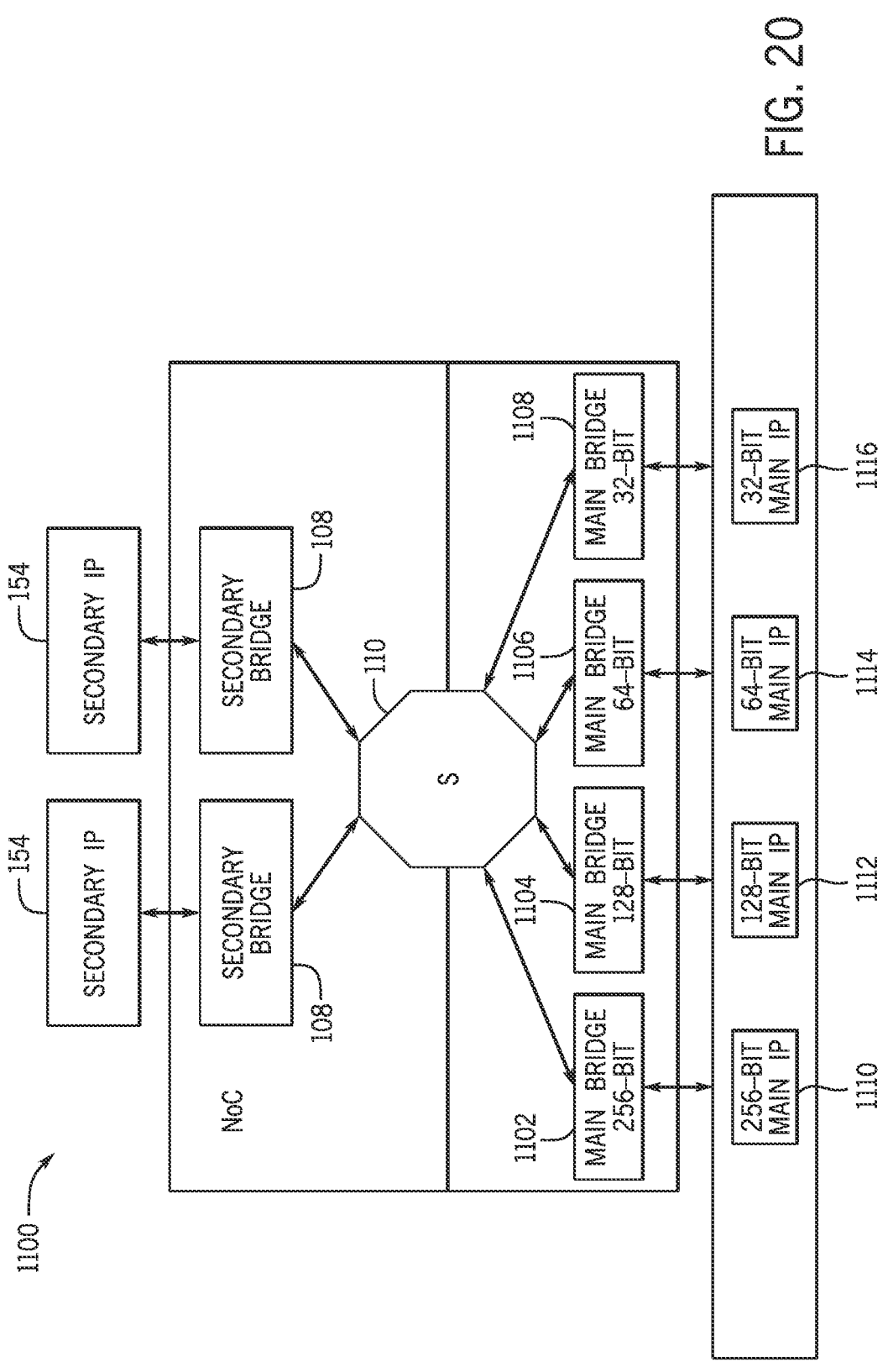
FIG. 20 is a schematic diagram of a system illustrating a portion of the NoC supporting multiple main bridges of varying data widths.

As previously stated, different applications running on an integrated circuit (e.g., the FPGA 102) may communicate using a variety of data widths. FIG. 20 is a schematic diagram of a system 1100 illustrating a portion of the NoC 104 supporting multiple main bridges 106 of varying data widths. The system 1100 includes a 256-bit main bridge 1102, a 128-bit main bridge 1104, a 64-bit main bridge 1106, and a 32-bit main bridge 1108. The main bridges may be electrically coupled to the switch 110 to communicate with the secondary IP 154 via the secondary bridges 108. To communicate with main IP that supports a particular data width, the NoC 104 may provide a main bridge that supports the same particular data width.

For example, to support a 256-bit main IP 1110 (e.g., a 256-bit processing element), the NoC 104 may provide the 256-bit main bridge 1102. To support a 128-bit main IP 1112 (e.g., a 128-bit processing element), the NoC 104 may provide the 128-bit main bridge 1104. To support a 64-bit main IP 1114 (e.g., a 64-bit processing element), the NoC 104 may provide the 64-bit main bridge 1106. To support a 32-bit main IP 1116 (e.g., a 32-bit processing element), the NoC 104 may provide the 32-bit main bridge 1108. However, main bridges may be large and draw significant power. Thus, implementing numerous main bridges may consume excessive area on the FPGA 102 and may consume excessive power. To avoid disposing numerous components such as the main bridges 1102-1108 on the FPGA 102, a flexible data width converter may be implemented to use dynamic widths in fewer (e.g., one) main bridges.

Figure 21:
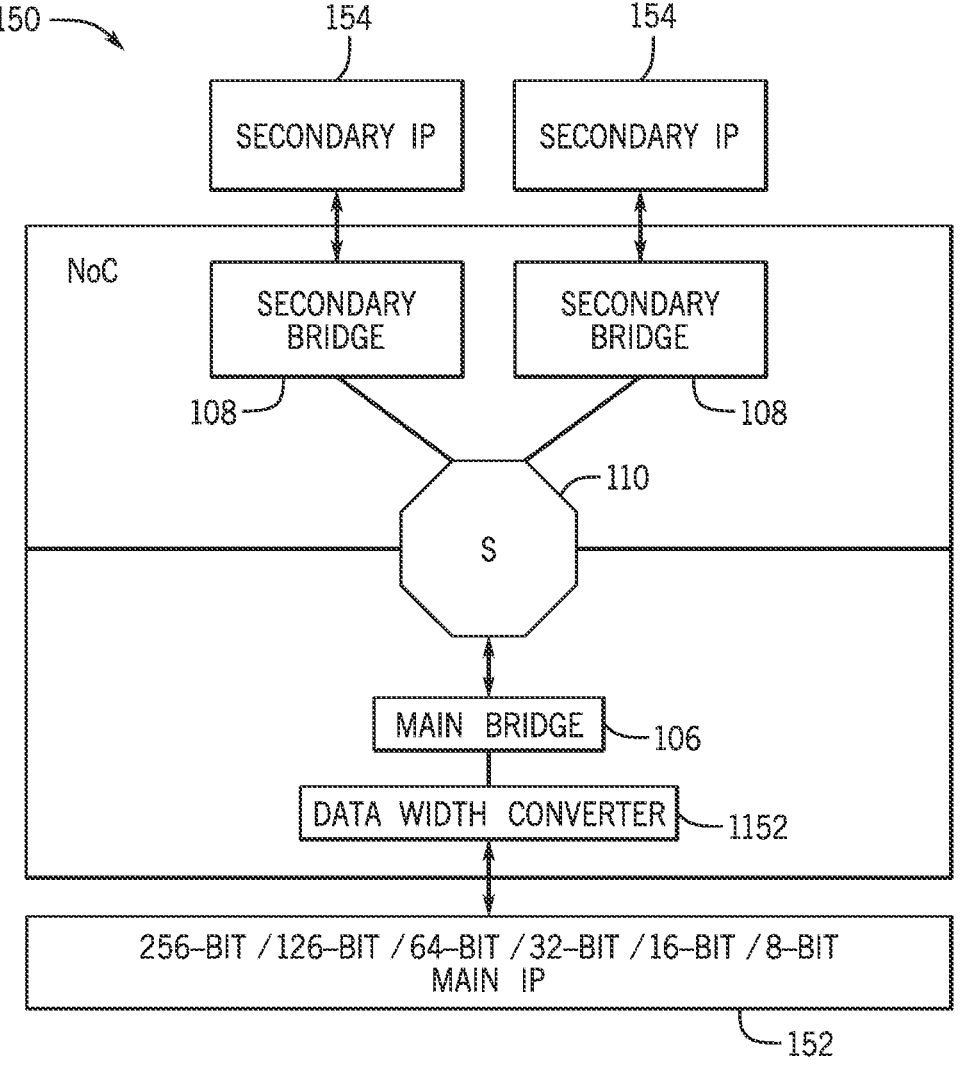
FIG. 21 is a schematic diagram of a system illustrating a portion of the NoC utilizing a data width converter, in accordance with an embodiment of the present disclosure.

FIG. 21 is a schematic diagram of a system 1150 illustrating a portion of the NoC 104 utilizing a data width converter 1152. The system 1150 may include the data width converter 1152 between the 256-bit main bridge 502 and the main IP 152. The data width converter 1152 may convert data received from the main bridge 106 to an appropriate width supported by the main IP 152 and may convert data received from the main IP 152 and sent to the main bridge 106 and the secondary IP 154. For example, the NoC 104 may facilitate communication with the main IP 152, which may support 256-bit, 128-bit, 32-bit, 16-bit, and/or 8-bit data.

To do so, the main bridge 106 may send 256-bit data to the data width converter 1152. To communicate with the main IP 152 that supports 256-bit data, the data width converter 1152 may leave the 256-bit data unchanged, as the data transferred between the main bridge 106 is already in a format supported by the main IP 152. For main IP 152 that supports 64-bit data, however, the data width converter 1152 may downconvert the 256-bit data to 64-bit data to communicate with the main IP 152 that supports 64-bit data. Likewise, for main IP 152 that supports 16-bit data, the data width converter 1152 may downconvert the 256-bit data to 16-bit data. Similarly, the data width converter 1152 may receive data from the main IP 152 that supports a first data width (e.g., 256-bit data, 128-bit data, 64-bit data, 32-bit data, 16-bit data, and so on) and may either downconvert or upconvert the data to a data width supported by the secondary IP 154 (e.g., 256-bit data, 128-bit data, 64-bit data, 32-bit data, 16-bit data, 8-bit data, and so on).

For example, the data width converter 1152 may receive 256-bit data from the main IP 152, and may downconvert the data to a data width supported by the secondary IP (e.g., 128-bit data, 64-bit data, 32-bit data, 16-bit data, 8-bit data, and so on) supported by the secondary IP 154. As may be observed, by utilizing the data width converter 1152, the NoC 104 may be designed with significantly fewer main bridges. As such, the data width converter 1152 may enable space and power conservation on the FPGA 102.

Figure 22:
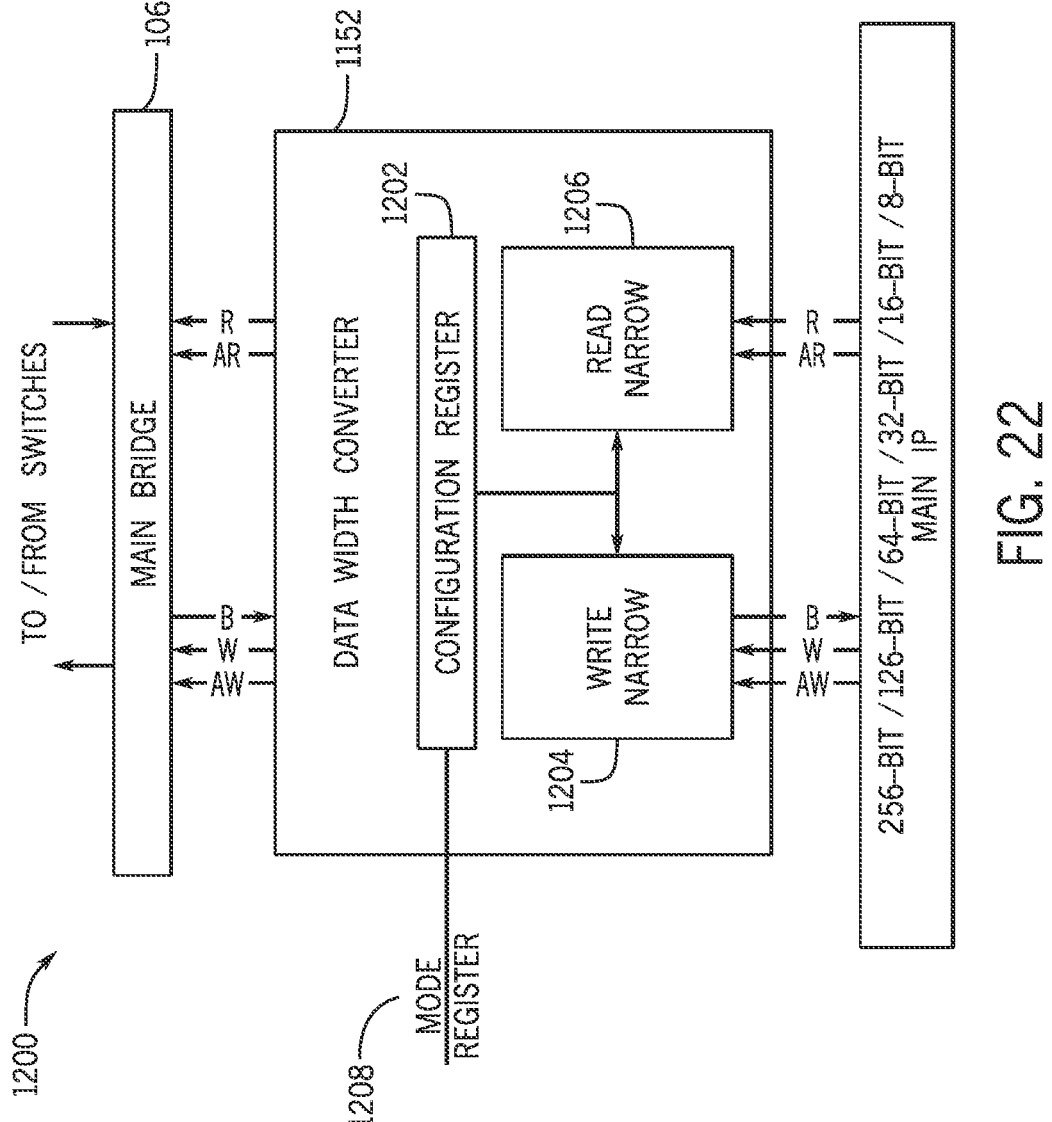
FIG. 22 is a system illustrating a detailed schematic diagram of the data width converter of FIG. 21, in accordance with an embodiment of the present disclosure.

FIG. 22 is a system 1200 illustrating a block diagram utilizing the data width converter 1152. To facilitate data transfer between the main IP 152 and the main bridge 106, the data width converter 1152 may include a configuration register 1202, write narrow circuitry 1204 and read narrow circuitry 1206. The configuration register 1202 may receive instructions from a mode register 1208 and, based on the instructions received from the mode register 1208, instruct the write narrow circuitry 1204 and/or the read narrow circuitry 1206 to convert data from a first data width to a second data width. The data width converter 1152 may convert data based on a particular communication protocol specification, including but not limited to the AMBA AXI4 protocol specification. The main IP 152 and the main bridge 106 may communicate using data channels that may be specified by a particular protocol specification. For example, if the main IP 152 and the main bridge 106 were to communicate using the AMBA AXI4 protocol, the main IP 152 and the main bridge 106 may communicate over the channels R, AR, B, W, and AW as shown in FIG. 22, where R is the read data channel, AR is the read address channel, B is the write response channel, W is the write data channel, and AW is the write address channel as defined by the AMBA AXI4 protocol.

FIG. 23 is an example of converting write data width via the data width converter 1152 using the AMBA AXI4 protocol. The table 1252 may include information relating to narrow data from the user logic. AWADDR indicates the write address in the AMBA AXI protocol, WDATA indicates 32-bit data, and WSTRB indicates a 4-bit write strobe. The WSTRB may indicate whether each burst is valid. As may be observed from the table 1252, the data may be processed in four bursts of 8-bits (1 byte) of data. It may be observed that there is one write strobe bit for each 8 bits of write data. As the WSTRB each has a hexadecimal value of 4'hF, where the F indicates a bit value of 15 bits, each WSTRB is high.

The table 1254 illustrates the data from the user logic once it has been adapted by the data width converter 1152 to 256-bit data such that the data may be processed by the main bridge 106. It may be observed that each byte of user logic data from the table 1252 is packed to occupy 32-bits of data on the main bridge 106. For instance, for WDATA0, the data from the user logic is packed to be preceded by 224 0s, and the WSTRB value of 32'h0000000F indicates that the least significant 15 bits are high, and thus are to be used to transfer the data. For WDATA1, the data is packed to be preceded by 192 0s and followed by 32 0s, and the WSTRB value of 32'000000F0 indicates that bits 16-32 are high, and thus are to be used to transfer the data. For WDATA2, the data from the user logic is packed to be preceded by 160 0s, followed by 64 0s, and the WSTRB value of 32'00000F00 indicates that bits 32-48 are high, and thus are to be used to transfer the data. For WDATA3, the data from the user logic is packed to be preceded by 128 0s and followed by 96 0s, and the WSTRB value of 32'0000F000 indicates that bits 48-64 are high, and thus are to be used to transfer the data.

FIG. 24 is another example of converting write data width via the data width convert 1152 using the AMBA AXI4 protocol. The example illustrated in FIG. 24 may operate similarly to the example illustrated in FIG. 23, the primary difference being that the user logic data is 128 bits converted by the data width converter 1152 into 256 bits at the main bridge 106. As may be observed in table 1302, the user logic data is distributed into four bursts, with each strobe being high indicating valid data (i.e., indicating that the bits are to be used to transfer the data). In the table 1304, it may be observed that the WDATA0 is converted to occupy bits 256-128, followed by 128 0s, and the WSTRB value of 32'h0000FFFF indicate that the least significant 128 bits are high, and thus are to be used to transfer the data. For WDATA1, the first 128 bits are 0s, and the data from the user logic is converted to occupy the last 128 bits, and the WSTRB value of 32'hFFFF0000 indicates that the most significant 128 bits are high, and thus are to be used to transfer the data.

As the converted data is 256 bits long, WDATA2, similarly to WDATA0, is converted to occupy the first 128 bits and the last 128 bits are 0s, with the WSTRB value of 32'h0000FFFF indicating that the least significant 128 bits are high, and thus are to be used to transfer the data. Similarly to WDATA1, for WDATA3 the first 128 bits are 0s, and the data from the user logic is converted to occupy the last 128 bits, and the WSTRB value of 32'hFFFF0000 indicates that the most significant 128 bits are high, and thus are to be used to transfer the data. As such, the data width convert 1152 may convert 128-bit write data to 256-bit write data.

Figure 25:
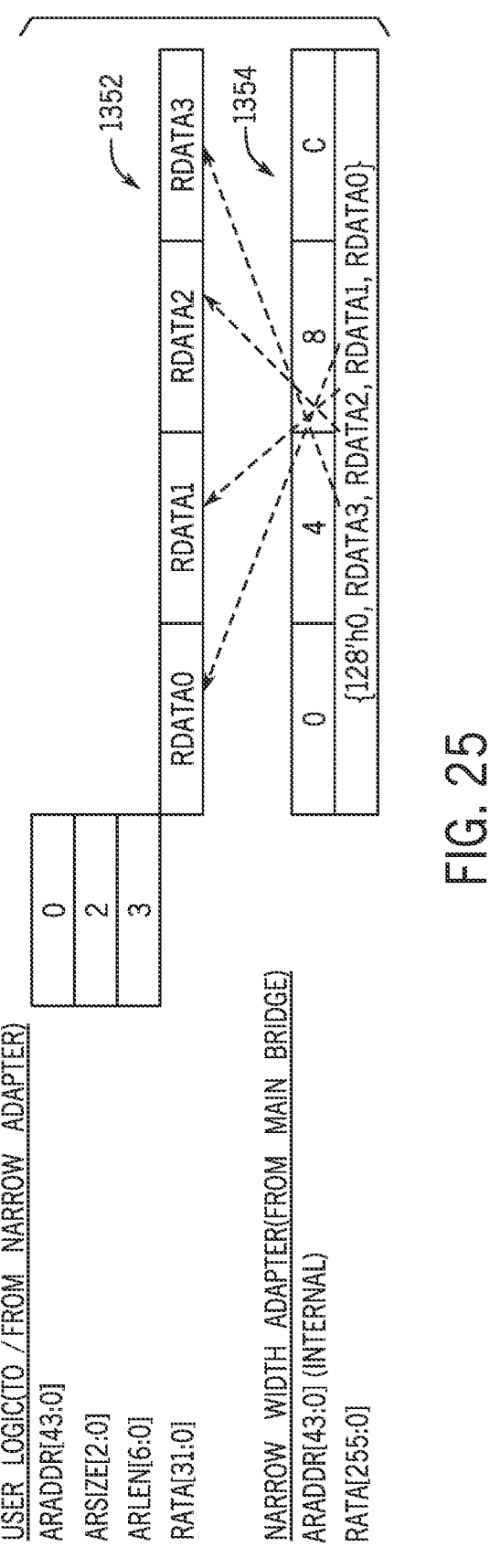
FIG. 25 is an example converting read data from a main bridge to a data size supported by the user logic via the data width converter of FIG. 21, in accordance with an embodiment of the present disclosure.

FIG. 25 is an example of converting read data from the main bridge to a data size supported by the user logic (e.g., the main IP 152). In FIG. 25, the data width converter 1152 may receive 128-bit data and convert it to 32-bit data. In some embodiments, a soft shim may be used to convert the data transferred from the main bridge 106 such that, from the user's perspective, the 128-bit data transferred from the main bridge 106 is 32-bit data.

While the embodiments set forth in the present disclosure may be susceptible to various modifications and alternative forms, specific embodiments have been shown by way of example in the drawings and have been described in detail herein. However, it should be understood that the disclosure is not intended to be limited to the particular forms disclosed. The disclosure is to cover all modifications, equivalents, and alternatives falling within the spirit and scope of the disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

Example Embodiments

EXAMPLE EMBODIMENT 1. A field-programmable gate array, comprising:
  a network-on-chip (NoC) communicatively coupled to one or more internal components and one or more external components, the NoC comprising:
    a first bridge configurable to receive data from the internal components;
    a second bridge configurable to transmit data to the one or more external components;
    one or more switches communicatively configurable to facilitate data transfer between the first bridge and the second bridge;
    a buffer configurable to store data transferred from the one or more internal components to the one or more external components; and
    dynamic data throttling circuitry configurable to adjust a rate of flow of the data transferred from the one or more internal components to the one or more external components based at least upon receiving a first control signal from the buffer, a second control signal from the buffer, or both.

EXAMPLE EMBODIMENT 2. The field-programmable gate array of example embodiment 1, wherein the buffer is configurable to:
  send the first control signal to the dynamic data throttling circuitry in response to determining that a first buffer threshold has been reached or exceeded;
  send the second control signal to the dynamic data throttling circuitry in response to determining that a second buffer threshold has been reached or exceeded; or
    both.

EXAMPLE EMBODIMENT 3. The field-programmable gate array of example embodiment 2, wherein the first buffer threshold, the second buffer threshold, or both are programmable.

EXAMPLE EMBODIMENT 4. The field-programmable gate array of example embodiment 1, wherein the dynamic data throttling circuitry is configurable to adjust the rate of flow of the data to a first throttling rate in response to receiving the first control signal.

EXAMPLE EMBODIMENT 5. The field-programmable gate array of example embodiment 4, wherein the dynamic data throttling circuitry is configurable to adjust the rate of flow of the data to a second throttling rate in response to receiving a third control signal, wherein the second throttling rate comprises an incremental difference from the first throttling rate.

EXAMPLE EMBODIMENT 6. The field-programmable gate array of example embodiment 1, wherein the dynamic data throttling circuitry is configurable to adjust the rate of flow of the data to a throttling rate of 100% in response to receiving an assertion of the second control signal.

EXAMPLE EMBODIMENT 7. The field-programmable gate array of example embodiment 1, wherein the dynamic data throttling circuitry comprises one or more hardware components implementing software instructions.

EXAMPLE EMBODIMENT 8. The field-programmable gate array of example embodiment 1, wherein the dynamic data throttling circuitry is disposed between a switch of the one or more switches and the one or more external components.

EXAMPLE EMBODIMENT 9. The field-programmable gate array of example embodiment 1, wherein the first bridge is configurable to determine a number of pending transactions received at the first bridge, and, in response to determining the number of pending transactions, transmit a first gating control signal, a second gating control signal, or both to the dynamic data throttling circuitry.

EXAMPLE EMBODIMENT 10. The field-programmable gate array of example embodiment 9, wherein, in response to receiving the first gating control signal, the second gating control signal, or both, the dynamic data throttling circuitry is configurable to adjust a number of transactions entering transaction gating circuitry.

EXAMPLE EMBODIMENT 11. The field-programmable gate array of example embodiment 9, wherein the first gating control signal comprises a pending write transaction signal, and the second gating control signal comprises a pending read transaction signal.

EXAMPLE EMBODIMENT 12. A method, comprising:
  receiving, from a data buffer, a first control signal indicating a first level of congestion at a first bridge, a second control signal indicating a second level of congestion at the first bridge, or both;
  receiving, from an external component, an enable signal;

in response to receiving the enable signal and the first control signal, the second control signal, or both, sending a target instruction to a throttle action controller, wherein the target instruction identifies the external component;

determining, at the throttle action controller, a throttle rate for incoming data to the external component based on whether the first control signal or the second control signal has been asserted; and throttling the incoming data to the identified external component at the determined throttle rate.

EXAMPLE EMBODIMENT 13. The method of example embodiment 12, wherein the throttle action controller comprises one or more hardware components implementing software instructions.

EXAMPLE EMBODIMENT 14. The method of example embodiment 12, comprising, in response to an assertion of the first control signal, throttling the incoming data at a first throttling rate.

EXAMPLE EMBODIMENT 15. The method of example embodiment 14, wherein the throttle action controller is configurable to adjust a rate of flow of the incoming data to a second throttling rate in response to receiving an assertion of the second control signal, where the second throttling rate is less than the first throttling rate.

EXAMPLE EMBODIMENT 16. The method of example embodiment 12, wherein receiving the enable signal comprises receiving the enable signal at target selection circuitry comprising one or more hardware components implementing software instructions.

EXAMPLE EMBODIMENT 17. A method, comprising:

receiving, at a hardened address mapper, a logical address from an internal component of an integrated circuit;

performing, at the hardened address mapper, a range check on a first memory type;

in response to determining that the logical address matches a first range corresponding to the first memory type, mapping, via the hardened address mapper, the logical address to a first physical address corresponding to the first memory type;

in response to determining that the logical address does not match the first range, performing a range check on a second memory type;

in response to determining that the logical address matches a second range corresponding to the second memory type, mapping, via the hardened address mapper, the logical address to a second physical address corresponding to the second memory type;

in response to determining that the logical address does not match the first range or the second range, performing a range check on a third memory type;

in response to determining that the logical address matches a third range corresponding to the third memory type, mapping, via the hardened address mapper, the logical address to a third physical address corresponding to the third memory type; and in response to determining that the logical address does not match the first range, the second range, or the third range, mapping the logical address to a default out-of-range address.

EXAMPLE EMBODIMENT 18. The method of example embodiment 17, wherein the first memory type comprises double data rate memory.

EXAMPLE EMBODIMENT 19. The method of example embodiment 17, wherein the second memory type comprises high bandwidth memory.

EXAMPLE EMBODIMENT 20. The method of example embodiment 17, wherein the integrated circuit comprises a field-programmable gate array.

What is claimed is:

1. A field-programmable gate array, comprising:

a network-on-chip (NoC) communicatively coupled to one or more internal components and one or more external components, the NoC comprising:

a first bridge configurable to receive data from the internal components;

a second bridge configurable to transmit data to the one or more external components;

one or more switches communicatively configurable to facilitate data transfer between the first bridge and the second bridge;

a buffer configurable to store data transferred from the one or more internal components to the one or more external components; and dynamic data throttling circuitry configurable to adjust a rate of flow of the data transferred from the one or more internal components to the one or more external components based at least upon receiving a first control signal from the buffer, a second control signal from the buffer, or both.

2. The field-programmable gate array of claim 1, wherein the buffer is configurable to:

send the first control signal to the dynamic data throttling circuitry in response to determining that a first buffer threshold has been reached or exceeded;

send the second control signal to the dynamic data throttling circuitry in response to determining that a second buffer threshold has been reached or exceeded; or both.

3. The field-programmable gate array of claim 2, wherein the first buffer threshold, the second buffer threshold, or both are programmable.

4. The field-programmable gate array of claim 1, wherein the dynamic data throttling circuitry is configurable to adjust the rate of flow of the data to a first throttling rate in response to receiving the first control signal.

5. The field-programmable gate array of claim 4, wherein the dynamic data throttling circuitry is configurable to adjust the rate of flow of the data to a second throttling rate in response to receiving a third control signal, wherein the second throttling rate comprises an incremental difference from the first throttling rate.

6. The field-programmable gate array of claim 1, wherein the dynamic data throttling circuitry is configurable to adjust the rate of flow of the data to a throttling rate of 100% in response to receiving an assertion of the second control signal.

7. The field-programmable gate array of claim 1, wherein the dynamic data throttling circuitry comprises one or more hardware components implementing software instructions.

8. The field-programmable gate array of claim 1, wherein the dynamic data throttling circuitry is disposed between a switch of the one or more switches and the one or more external components.

9. The field-programmable gate array of claim 1, wherein the first bridge is configurable to determine a number of pending transactions received at the first bridge, and, in response to determining the number of pending transactions, transmit a first gating control signal, a second gating control signal, or both to the dynamic data throttling circuitry.

10. The field-programmable gate array of claim 9, wherein, in response to receiving the first gating control signal, the second gating control signal, or both, the dynamic data throttling circuitry is configurable to adjust a number of transactions entering transaction gating circuitry.

11. The field-programmable gate array of claim 9, wherein the first gating control signal comprises a pending write transaction signal, and the second gating control signal comprises a pending read transaction signal.

* * * * *